(12) United States Patent
Maruyama et al.

(10) Patent No.: US 8,958,993 B2
(45) Date of Patent: Feb. 17, 2015

(54) SWITCHING-DEVICE REMAINING LIFETIME DIAGNOSIS METHOD AND APPARATUS

(75) Inventors: Akihiko Maruyama, Tokyo (JP); Yuko Maruyama, legal representative, Takarazuka (JP); Katsuhiko Horinouchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 674 days.

(21) Appl. No.: 13/148,817

(22) PCT Filed: Feb. 23, 2009

(86) PCT No.: PCT/JP2009/053164
§ 371 (c)(1),
(2), (4) Date: Sep. 28, 2011

(87) PCT Pub. No.: WO2010/095259
PCT Pub. Date: Aug. 26, 2010

(65) Prior Publication Data
US 2012/0022797 A1    Jan. 26, 2012

(51) Int. Cl.
*G01B 7/16* (2006.01)
*G01R 19/165* (2006.01)
(Continued)

(52) U.S. Cl.
CPC ........ *G05B 23/0283* (2013.01); *G01R 31/3274* (2013.01); *H01H 3/001* (2013.01); *H01H 33/6662* (2013.01); *H01H 2071/044* (2013.01)
USPC .................... 702/34; 702/58; 702/62; 702/64

(58) Field of Classification Search
USPC ......... 702/58, 62, 64, 65, 158, 170, 178, 182, 702/183, 184; 73/53.01; 320/134; 374/102; 700/83
See application file for complete search history.

(56) References Cited

U.S. PATENT DOCUMENTS 5,638,296 A    6/1997  Johnson et al.
6,880,967 B2 *  4/2005  Isozumi et al. ............... 374/102
(Continued)

FOREIGN PATENT DOCUMENTS

JP    61 18845    1/1986
JP    2002 149230    5/2002
(Continued)

OTHER PUBLICATIONS

International Search Report Issued Apr. 14, 2009 in PCT/JP09/053164 filed Feb. 23, 2009.

Primary Examiner — Eliseo Ramos Feliciano
Assistant Examiner — Felix Suarez
(74) Attorney, Agent, or Firm — Oblon, Spivak, McClelland, Maier & Neustadt, L.L.P.

(57) ABSTRACT

There are provided a switching-device remaining lifetime diagnosis method and a switching-device remaining lifetime diagnosis apparatus, wherein as status amount history data, there are accumulated status amounts related to a deterioration status of a switching device, estimated based on measurement data obtained through measurement of performance characteristics of the switching device; based on the accumulated status amount history data, there are created a plurality of system data pieces in which the status amounts are arranged with the respective abscissas of an elapsed time during an operation period of the switching device, the number of operations of the switching device, an inoperative time of the switching device, and an accumulated operation time of the switching device; based on the created system data pieces, the remaining lifetime of the switching device is estimated.

20 Claims, 15 Drawing Sheets

(51) Int. Cl.
  *G01R 11/23* (2006.01)
  *G01R 11/25* (2006.01)
  *G05B 23/02* (2006.01)
  *G01R 31/327* (2006.01)
  *H01H 3/00* (2006.01)
  *H01H 33/666* (2006.01)
  *H01H 71/04* (2006.01)

(56) References Cited

U.S. PATENT DOCUMENTS 7,117,050 B2 * 10/2006 Sasaki et al. .................. 700/83
7,581,434 B1 * 9/2009 Discenzo et al. ............. 73/53.01
7,633,265 B2 * 12/2009 Matsushima et al. ......... 320/134
8,521,459 B2 * 8/2013 Watanabe et al. ............... 702/65
2007/0222427 A1 9/2007 Takeuchi et al.

FOREIGN PATENT DOCUMENTS

| | | |
|---|---|---|
| JP | 2003 111497 | 4/2003 |
| JP | 2004 192441 | 7/2004 |
| JP | 2004 258703 | 9/2004 |
| JP | 2004 324548 | 11/2004 |
| JP | 2009 8427 | 1/2009 |
| WO | 2005 111641 | 11/2005 |

* cited by examiner

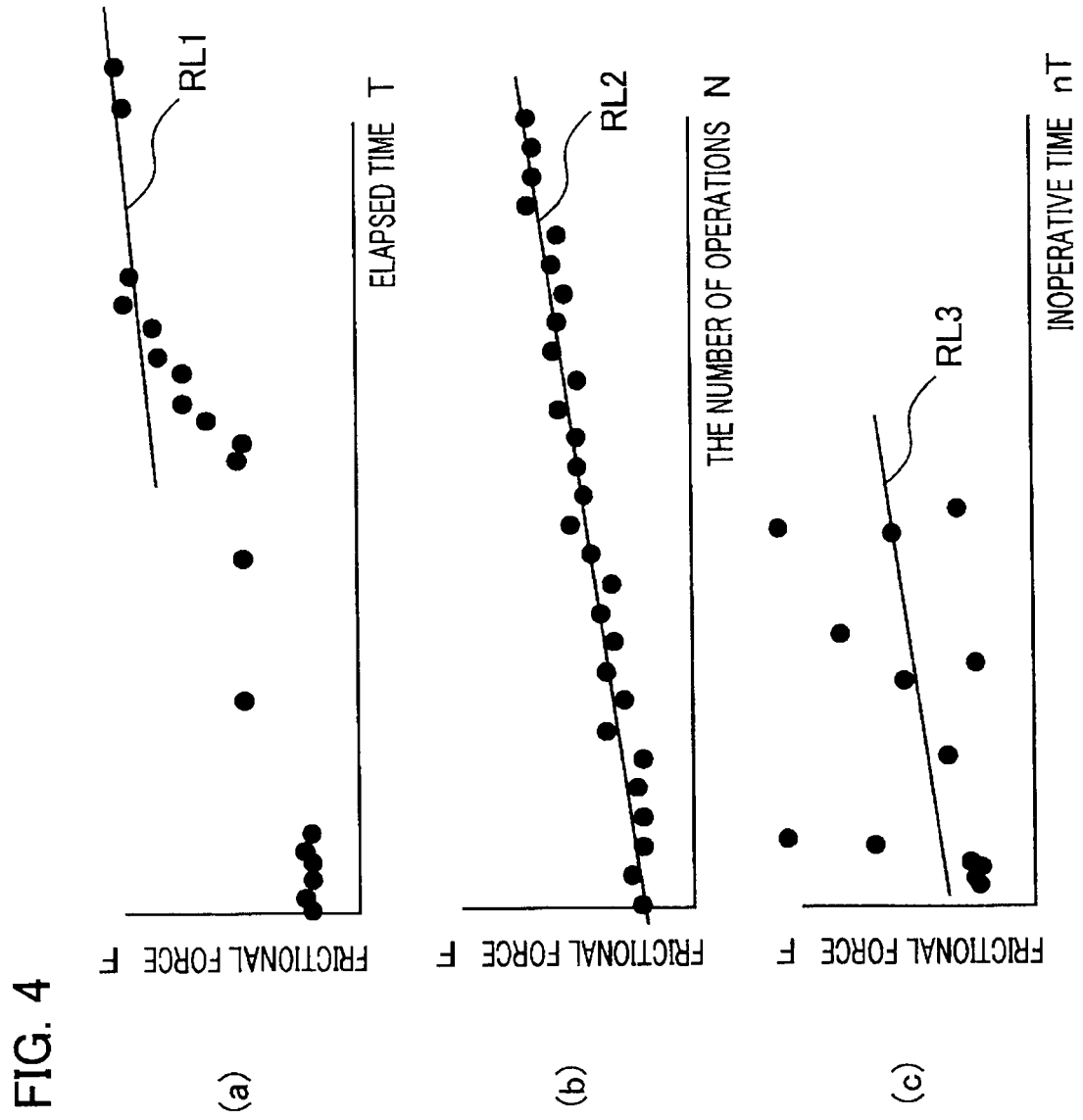

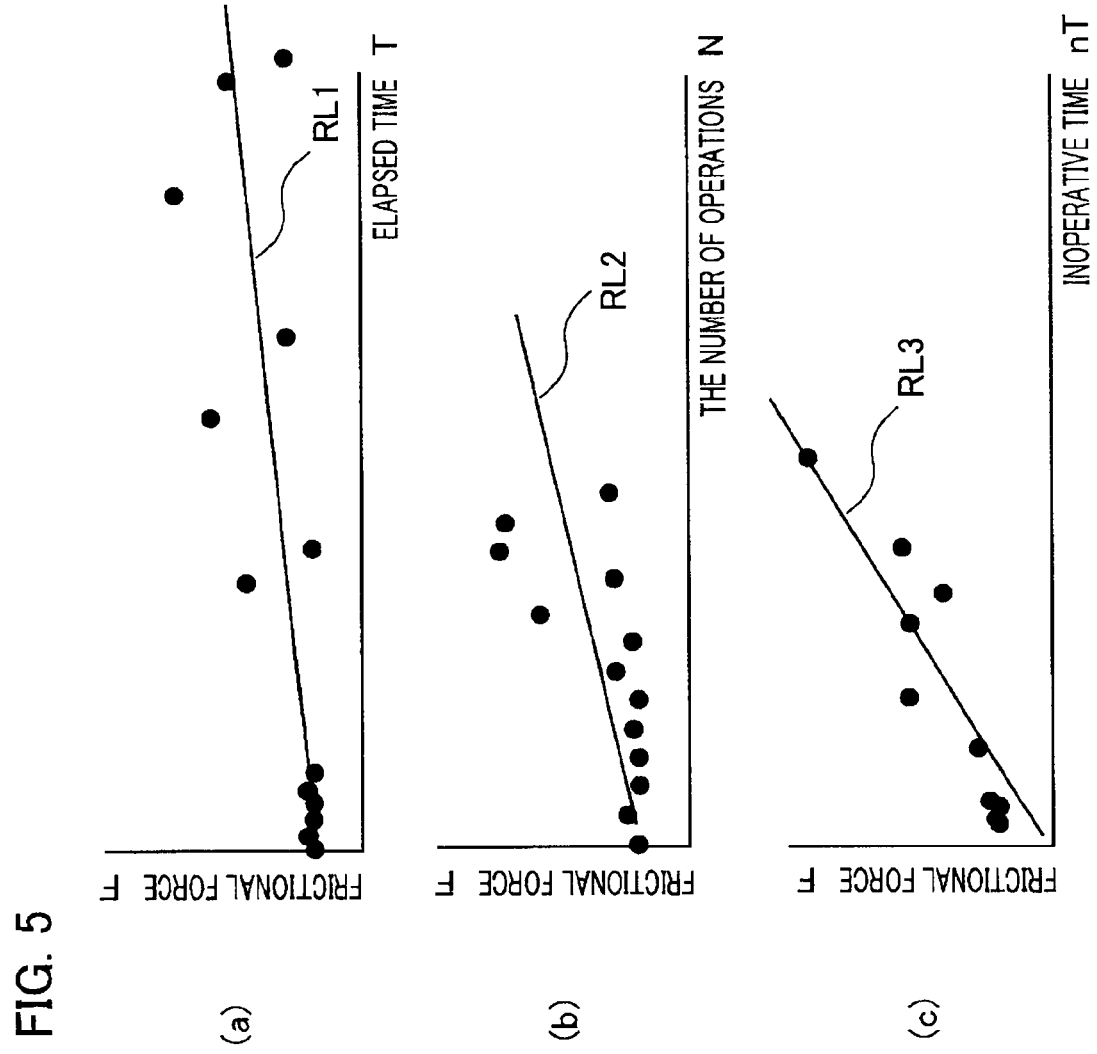

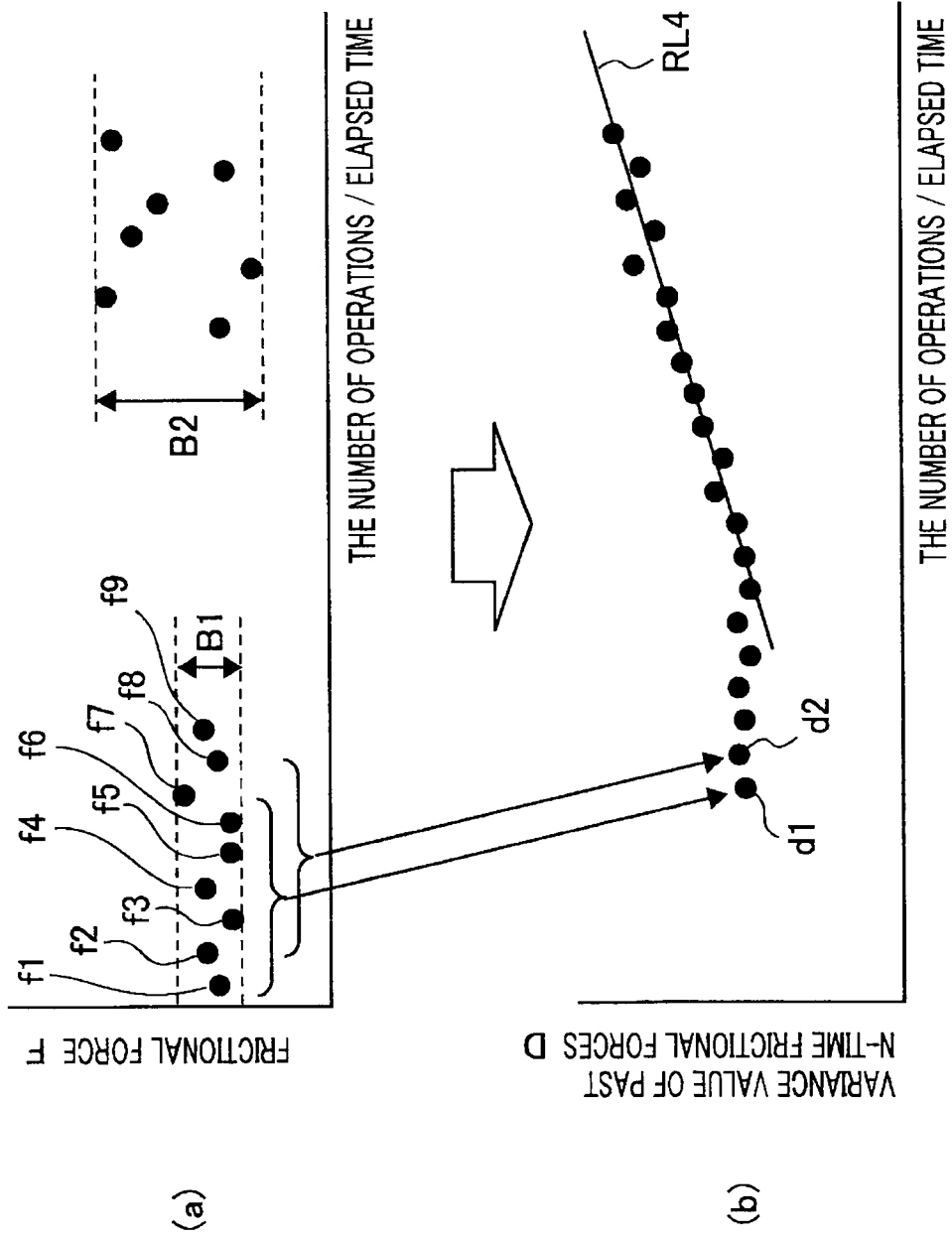

SWITCHING-DEVICE REMAINING LIFETIME DIAGNOSIS METHOD AND APPARATUS

BACKGROUND OF THE INVENTION

1. Field of the Invention

The present invention relates to a switching-device remaining lifetime diagnosis method in which the remaining lifetime of a switching device is diagnosed based on the performance characteristics of the switching device and to a remaining lifetime diagnosis apparatus utilizing the remaining lifetime diagnosis method.

2. Description of Related Art

In general, a switching device such as an electric power switching device (simply referred to as a switching device, hereinafter) is provided with a fixed contact, a movable contact that is provided in such a way as to face the fixed contact, and a driving mechanism that drives the movable contact in such a way that the movable contact comes in contact with the fixed contact or is separated from the fixed contact. The deterioration in such a switching device develops due to contributing factors such as an elapsed time from a time point when the switching device has initially started its operation, the number of operations, the time period of non-operation, and foreign materials in its moving parts; at a certain time point, the performance characteristics thereof deviate from a predetermined service condition and the remaining lifetime thereof expires. Therefore, in general, a status monitoring apparatus monitors the operation status and the like of a switching device so as to diagnose the deterioration status of the performance characteristics and the remaining lifetime.

A conventional status monitoring apparatus for a switching device periodically calculates the changing rate of the performance characteristics of a switching device, which is a monitoring subject; based on the calculated changing rate of the performance characteristics, the status monitoring apparatus estimates the time in which the performance characteristics reach a predetermined reference value or a possible number of operations (e.g., refer to Patent Document 1). In the case where deterioration in the performance characteristics of a switching device is caused by a single contributing factor and the performance characteristics of the switching device monotonously develops toward the deterioration, such a conventional switching-device status monitoring apparatus is effective for diagnosing the deterioration status of the performance characteristics of the switching device or the remaining lifetime of the switching device.

[Patent Document 1] Japanese Patent Application Laid-Open No. 2002-149230

BRIEF SUMMARY OF THE INVENTION

Problems to be Solved by the Invention

However, in practice, deterioration of the performance characteristics of a switching device is caused by two or more mixed contributing factors. In many cases, deterioration or change in the performance characteristics of a switching device tends to not only monotonously worsen but also alternately repeat temporary worsening and restoration. Accordingly, it is difficult for a conventional switching-device status monitoring apparatus to perform status monitoring or prediction of the remaining lifetime, in accordance with the actual status of a switching device.

The present invention has been implemented in order to solve the foregoing problem in a conventional system; the objective thereof is to obtain a switching-device remaining lifetime diagnosis method and a switching-device remaining lifetime diagnosis apparatus that are capable of accurately estimating the remaining lifetime of a switching device.

Means for Solving the Problem

In a switching-device remaining lifetime diagnosis method according to the present invention, performance characteristics of a switching device are obtained by a measurement unit, and then, as status amount history data, there are accumulated status amounts related to a deterioration status, of the switching device, estimated by a status amount estimation unit based on measurement data obtained by the measurement unit; based on the accumulated status amount history data, a remaining lifetime estimation unit creates two or more system data pieces among system data in which the status amounts are arranged with the abscissa of at least part of an elapsed time during an operation period of the switching device, system data in which the status amounts are arranged with the abscissa of the number of operations of the switching device during the at least part of an elapsed time, system data in which the status amounts are arranged with the abscissa of an inoperative time of the switching device during the at least part of an elapsed time, and system data in which the status amounts are arranged with the abscissa of an accumulated operation time of the switching device during the at least part of an elapsed time; based on the system data, among the created two or more system data pieces, in which the correlation between the abscissas of the created system data pieces and the status amounts corresponding to the respective abscissas becomes the strongest, a first deterioration tendency of the switching device is extracted; based on the extracted first deterioration tendency, a first estimation value of the remaining lifetime of the switching device is calculated; the extracted first deterioration tendency is removed from the created two or more system data pieces; based on the system data, among the two or more system data pieces from which the first deterioration tendency has been removed, in which the correlation between the abscissas of the system data pieces from which the first deterioration tendency has been removed and the status amounts corresponding to the respective abscissas becomes strongest, a second deterioration tendency is extracted; based on the extracted second deterioration tendency, a second estimation value of the remaining lifetime of the switching device is calculated; and based on at least the first estimation value and the second estimation value of the remaining lifetime, the remaining lifetime of the switching device is determined.

Moreover, in a switching-device remaining lifetime diagnosis method according to the present invention, performance characteristics of a switching device are obtained by a measurement unit, and then, as status amount history data, there are accumulated status amounts related to a deterioration status, of the switching device, estimated by a status amount estimation unit based on measurement data obtained by the measurement unit; the status amounts in the accumulated status amount history data are transformed by use of a predetermined transformation function into predetermined status amounts, and then a remaining lifetime estimation unit creates two or more system data pieces among system data in which the predetermined status amounts are arranged with the abscissa of at least part of an elapsed time during an operation period of the switching device, system data in which the predetermined status amounts are arranged with the abscissa of the number of operations of the switching device during the at least part of an elapsed time, system data in which the predetermined status amounts are arranged with the abscissa of an inoperative time of the switching device during the at least part of an elapsed time, and system data in which the predetermined status amounts are arranged with the abscissa of an accumulated operation time of the switching device during the at least part of an elapsed time; based on the system data, among the created two or more system data pieces, in which the correlation between the abscissas of the created system data pieces and the predetermined status amounts corresponding to the respective abscissas becomes strongest, a first deterioration tendency of the switching device is extracted; based on the extracted first deterioration tendency, a first estimation value of the remaining lifetime of the switching device is calculated; the extracted first deterioration tendency is removed from the created two or more system data pieces; based on the system data, among the two or more system data pieces from which the first deterioration tendency has been removed, in which the correlation between the abscissas of the system data pieces from which the first deterioration tendency has been removed and the predetermined status amounts corresponding to the respective abscissas becomes strongest, a second deterioration tendency is extracted; based on the extracted second deterioration tendency, a second estimation value of the remaining lifetime of the switching device is calculated; and based on at least the first estimation value and the second estimation value of the remaining lifetime, the remaining lifetime of the switching device is determined.

Still moreover, in a switching-device remaining lifetime diagnosis method according to the present invention, performance characteristics of a switching device are obtained by a measurement unit, and then, as status amount history data, there are accumulated, in a storage unit, status amounts related to a deterioration status, of the switching device, estimated by a status amount estimation unit based on measurement data obtained by the measurement unit; based on the accumulated status amount history data, there are created two or more total-elapsed-time system data pieces among total-elapsed-time system data in which the status amounts are arranged with the abscissa of a total elapsed time during an operation period of the switching device, total-elapsed-time system data in which the status amounts are arranged with the abscissa of the number of operations of the switching device during the total elapsed time, total-elapsed-time system data in which the status amounts are arranged with the abscissa of an inoperative time of the switching device during the total elapsed time, and total-elapsed-time system data in which the status amounts are arranged with the abscissa of an accumulated operation time of the switching device during the total elapsed time, and, at the same time, a remaining lifetime estimation unit creates two or more post-predetermined-period system data pieces among post-predetermined-period system data in which the status amounts are arranged with the abscissa of an elapsed time during a period after the time point when a predetermined period has elapsed from a time point when the switching device had initially started to operate, post-predetermined-period system data in which the status amounts are arranged with the abscissa of the number of operations of the switching device during a period after the time point when the predetermined period has elapsed, post-predetermined-period system data in which the status amounts are arranged with the abscissa of an inoperative time of the switching device during a period after the time point when the predetermined period has elapsed, and post-predetermined-period system data in which the status amounts are arranged with the abscissa of an accumulated operation time of the switching device during a period after the time point when the predetermined period has elapsed; based on the system data, among the created two or more total-elapsed-time system data pieces or the created two or more post-predetermined-period system data pieces, in which the correlation between the abscissas of the created system data pieces and the status amounts corresponding to the respective abscissas becomes strongest, a first deterioration tendency of the switching device is extracted; based on the extracted first deterioration tendency, a first estimation value of the remaining lifetime of the switching device is calculated; the extracted first deterioration tendency is removed from the created two or more system data pieces; based on the system data, among the two or more system data pieces from which the first deterioration tendency has been removed, in which the correlation between the abscissas of the system data pieces from which the first deterioration tendency has been removed and the status amounts corresponding to the respective abscissas becomes strongest, a second deterioration tendency is extracted; based on the extracted second deterioration tendency, a second estimation value of the remaining lifetime of the switching device is calculated; and based on at least the first estimation value and the second estimation value of the remaining lifetime, the remaining lifetime of the switching device is determined.

A switching-device remaining lifetime diagnosis apparatus according to the present invention is to diagnose the remaining lifetime of a switching device that drives a movable contact by a driving mechanism in such a way that the movable contact makes contact with or is separated from a fixed contact, in order to open or close an electric circuit; the switching-device remaining lifetime diagnosis apparatus includes a measurement unit for measuring performance characteristics of the switching device, a status amount estimation unit for estimating a status amount related to a deterioration status of the switching device, based on measurement data obtained by the measurement unit, a recording unit for recording as status amount history data the status amount estimated by the status amount estimation unit, and a remaining lifetime estimation unit for estimating the remaining lifetime of the switching device, based on the status amount history data recorded in the recording unit. The switching-device remaining lifetime diagnosis apparatus according to the present invention is characterized in that based on the accumulated status amount history data, the remaining lifetime estimation unit creates two or more system data pieces among system data in which the status amounts are arranged with the abscissa of at least part of an elapsed time during an operation period of the switching device, system data in which the status amounts are arranged with the abscissa of the number of operations of the switching device during the elapsed time, system data in which the status amounts are arranged with the abscissa of an inoperative time of the switching device during the elapsed time, and system data in which the status amounts are arranged with the abscissa of an accumulated operation time of the switching device during the elapsed time; based on the system data, among the created two or more system data pieces, in which the correlation between the abscissas of the created system data pieces and the status amounts corresponding to the respective abscissas becomes strongest, a first deterioration tendency of the switching device is extracted; based on the extracted first deterioration tendency, a first estimation value of the remaining lifetime of the switching device is calculated; the extracted first deterioration tendency is removed from the created two or more system data pieces; based on the system data, among the two or more system data pieces from which the first deterioration tendency has been removed, in which the correlation between the abscissas of the system data pieces from which the first deterioration tendency has been removed and the status amounts corresponding to the respective abscissas becomes strongest, a second deterioration tendency is extracted; based on the extracted second deterioration tendency, a second estimation value of the remaining lifetime of the switching device is calculated; and based on at least the first estimation value and the second estimation value of the remaining lifetime, the remaining lifetime of the switching device is determined.

Moreover, a switching-device remaining lifetime diagnosis apparatus according to the present invention is to diagnose the remaining lifetime of a switching device that drives a movable contact by a driving mechanism in such a way that the movable contact makes contact with or is separated from a fixed contact, in order to open or close an electric circuit; the switching-device remaining lifetime diagnosis apparatus includes a measurement unit for measuring performance characteristics of the switching device, a status amount estimation unit for estimating a status amount related to a deterioration status of the switching device, based on measurement data obtained by the measurement unit, a recording unit for recording as status amount history data the status amount estimated by the status amount estimation unit, and a remaining lifetime estimation unit for estimating the remaining lifetime of the switching device, based on the status amount history data recorded in the recording unit. The switching-device remaining lifetime diagnosis apparatus according to the present invention is characterized in that the remaining lifetime estimation unit transforms the status amounts in the accumulated status amount history data by use of a predetermined transformation function into predetermined status amounts, and then creates two or more system data pieces among system data in which the predetermined status amounts are arranged with the abscissa of at least part of an elapsed time during an operation period of the switching device, system data in which the predetermined status amounts are arranged with the abscissa of the number of operations of the switching device during the at least part of an elapsed time, system data in which the predetermined status amounts are arranged with the abscissa of an inoperative time of the switching device during the at least part of an elapsed time, and system data in which the predetermined status amounts are arranged with the abscissa of an accumulated operation time of the switching device during the at least part of an elapsed time; based on the system data, among the created two or more system data pieces, in which the correlation between the abscissas of the created system data pieces and the predetermined status amounts corresponding to the respective abscissas becomes strongest, a first deterioration tendency of the switching device is extracted; based on the extracted first deterioration tendency, a first estimation value of the remaining lifetime of the switching device is calculated; the extracted first deterioration tendency is removed from the created two or more system data pieces; based on the system data, among the two or more system data pieces from which the first deterioration tendency has been removed, in which the correlation between the abscissas of the system data pieces from which the first deterioration tendency has been removed and the predetermined status amounts corresponding to the respective abscissas becomes strongest, a second deterioration tendency is extracted; based on the extracted second deterioration tendency, a second estimation value of the remaining lifetime of the switching device is calculated; and based on at least the first estimation value and the second estimation value of the remaining lifetime, the remaining lifetime of the switching device is determined.

Still moreover, a switching-device remaining lifetime diagnosis apparatus according to the present invention is to diagnose the remaining lifetime of a switching device that drives a movable contact by a driving mechanism in such a way that the movable contact makes contact with or is separated from a fixed contact, in order to open or close an electric circuit; the switching-device remaining lifetime diagnosis apparatus includes a measurement unit for measuring performance characteristics of the switching device, a status amount estimation unit for estimating a status amount related to a deterioration status of the switching device, based on measurement data obtained by the measurement unit, a recording unit for recording as status amount history data the status amount estimated by the status amount estimation unit, and a remaining lifetime estimation unit for estimating the remaining lifetime of the switching device, based on the status amount history data recorded in the recording unit; based on the accumulated status amount history data, the remaining lifetime estimation unit creates two or more total-elapsed-time system data pieces among total-elapsed-time system data in which the status amounts are arranged with the abscissa of a total elapsed time during an operation period of the switching device, total-elapsed-time system data in which the status amounts are arranged with the abscissa of the number of operations of the switching device during the total elapsed time, total-elapsed-time system data in which the status amounts are arranged with the abscissa of an inoperative time of the switching device during the total elapsed time, and total-elapsed-time system data in which the status amounts are arranged with the abscissa of an accumulated operation time of the switching device during the total elapsed time, and, at the same time, creates two or more post-predetermined-period system data pieces among post-predetermined-period system data in which the status amounts are arranged with the abscissa of an elapsed time during a period after the time point when a predetermined period has elapsed from a time point when the switching device had initially started to operate, post-predetermined-period system data in which the status amounts are arranged with the abscissa of the number of operations of the switching device in an elapsed time during a period after the time point when the predetermined period has elapsed, post-predetermined-period system data in which the status amounts are arranged with the abscissa of an inoperative time of the switching device in an elapsed time during a period after the time point when the predetermined period has elapsed, and post-predetermined-period system data in which the status amounts are arranged with the abscissa of an accumulated operation time of the switching device in an elapsed time during a period after the time point when the predetermined period has elapsed; based on the system data, among the created two or more total-elapsed-time system data pieces or the created two or more post-predetermined-period system data pieces, in which the correlation between the abscissas of the created system data pieces and the status amounts corresponding to the respective abscissas becomes strongest, a first deterioration tendency of the switching device is extracted; based on the extracted first deterioration tendency, a first estimation value of the remaining lifetime of the switching device is calculated; the extracted first deterioration tendency is removed from the created two or more system data pieces; based on the system data, among the two or more system data pieces from which the first deterioration tendency has been removed, in which the correlation between the abscissas of the system data pieces from which the first deterioration tendency has been removed and the status amounts corresponding to the respective abscissas becomes strongest, a second deterioration tendency is extracted; based on the extracted second deterioration tendency, a second estimation value of the remaining lifetime of the switching device is calculated; and based on at least the first estimation value and the second estimation value, the remaining lifetime of the switching device is determined.

In the present invention, the status amount related to the deterioration status of a switching device denotes a status amount for specifying the deterioration status of the switching device; for example, a contact wear and tear amount, frictional force exerted on a sliding portion at a time when the switching device is driven, the capacitance of a driving capacitor, or the like correspond to the status amount.

"Periods after the time point when a predetermined period has elapsed from a time point when the switching device had initially started to operate" in the present invention include, for example, the recent period for a time point when the remaining lifetime of the switching device is diagnosed; the range of the recent period is appropriately determined by the type of the switching device, the frequency of opening/closing operations of the switching device, a material that forms the sliding portion, or the like.

In the present invention, the system data pieces in each of the embodiments are independent; the system data pieces with the same names do not necessarily denote the respective system data pieces with the same contents.

Advantage of the Invention

The switching-device remaining lifetime diagnosis method of the present invention makes it possible to separate deterioration factors caused in a switching device, so that the remaining lifetime can accurately be estimated.

The switching-device remaining lifetime diagnosis method of the present invention makes it possible to estimate the remaining lifetime of a switching device even in the case of a deterioration factor that does not indicate any deterioration tendency in system data in which status amounts are arranged with the abscissa of an elapsed time, the number of operations, an inoperative time, or an accumulated time.

Even in the case where in system data in which status amounts are arranged with the abscissa of a total elapsed time during an operation period of a switching device, the number of total operations, a total inoperative time, or a total accumulated time, no deterioration tendency appears, the switching-device remaining lifetime diagnosis method of the present invention makes it possible to indicate a deterioration tendency by use of at least one of system data in which the status amounts are arranged with the abscissa of an elapsed time during a period after the time point when a predetermined period has elapsed from a time point when the switching device had initially started to operate, system data in which the status amounts are arranged with the abscissa of the number of operations of the switching device during a period after the time point when the predetermined period has elapsed, system data in which the status amounts are arranged with the abscissa of an inoperative time of the switching device during a period after the time point when the predetermined period has elapsed, and system data in which the status amounts are arranged with the abscissa of an accumulated operation time of the switching device during a period after the time point when the predetermined period has elapsed; therefore, the remaining lifetime of the switching device can more accurately be estimated with a simple configuration.

The switching-device remaining lifetime diagnosis apparatus of the present invention makes it possible with a simple configuration to separate deterioration factors caused in a switching device, so that the remaining lifetime can accurately be estimated.

The switching-device remaining lifetime diagnosis apparatus of the present invention makes it possible to more accurately estimate the remaining lifetime of a switching device.

Even in the case where in system data in which the status amounts are arranged with the abscissa of a total elapsed time during an operation period of a switching device, the number of total operations, a total inoperative time, or a total accumulated time, no deterioration tendency appears, the switching-device remaining lifetime diagnosis apparatus of the present invention makes it possible to indicate a deterioration tendency by use of at least one of system data in which the status amounts are arranged with the abscissa of an elapsed time during a period after the time point when a predetermined period has elapsed from a time point when the switching device had initially started to operate, system data in which the status amounts are arranged with the abscissa of the number of operations of the switching device during a period after the time point when the predetermined period has elapsed, system data in which the status amounts are arranged with the abscissa of an inoperative time of the switching device during a period after the time point when the predetermined period has elapsed, and system data in which the status amounts are arranged with the abscissa of an accumulated operation time of the switching device during a period after the time point when the predetermined period has elapsed; therefore, the remaining lifetime of the switching device can more accurately be estimated with a simple configuration.

In the switching-device remaining lifetime diagnosis apparatus of the present invention, in the case where a plurality of switching devices is arranged in a single and the same plant, the remaining lifetime estimation unit creates at least one of the system data pieces for the switching device, among the plurality of the switching devices, that has been most frequently operated, and estimates the remaining lifetimes of the other switching devices, based on the created system data pieces; therefore, there can accurately be estimated the remaining lifetime of a switching device for which there exists no status amount history data.

BRIEF DESCRIPTION OF THE SEVERAL VIEWS OF THE DRAWINGS

FIG. 4 is a set of graphs representing a case where frictional force F caused by wear and tear in a sliding portion is rendered as data in three different systems;

FIG. 5 is a set of graphs representing a case where frictional force F caused by solidification of lubricant is rendered as data in three different systems, based on status amount history data;

FIG. 7 is a set of explanatory charts for explaining a switching-device remaining lifetime diagnosis apparatus according to Embodiment 2 of the present invention;

BEST MODE FOR CARRYING OUT THE INVENTION

Hereinafter, Embodiments 1 through 11 of the present invention will be explained; system data pieces in each of the embodiments are independent, and system data pieces with the same names do not necessarily denote respective system data pieces with the same contents.

Embodiment 1

Figure 1:
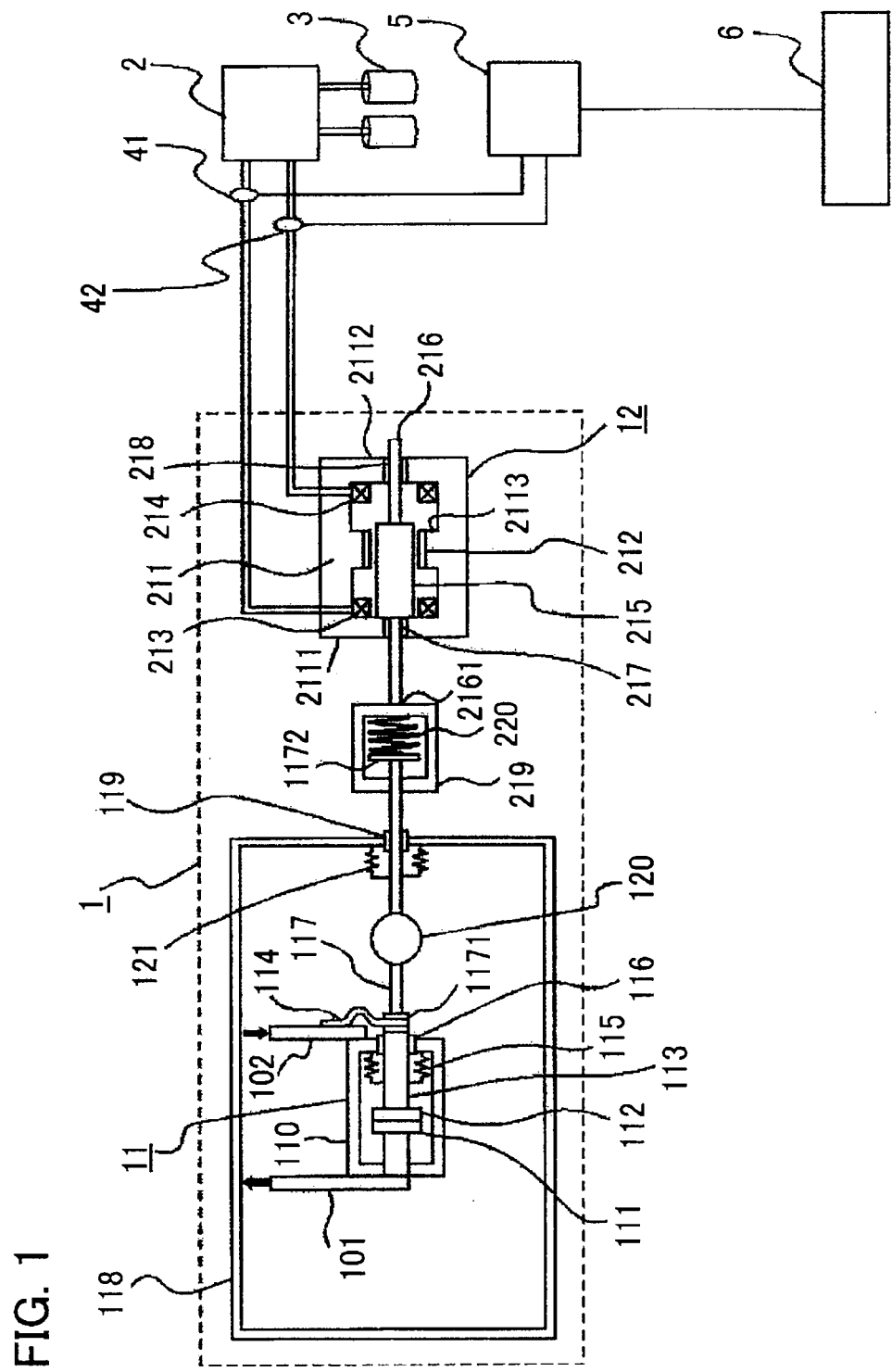
FIG. 1 is a configuration diagram illustrating a switching-device remaining lifetime diagnosis apparatus according to Embodiment 1 of the present invention.

Hereinafter, a switching-device remaining lifetime diagnosis apparatus according to Embodiment 1 of the present invention will be explained in detail. FIG. 1 is a configuration diagram illustrating a switching-device remaining lifetime diagnosis apparatus according to Embodiment 1 of the present invention. A switching-device remaining lifetime diagnosis method according to Embodiment 1 of the present invention is implemented by a switching-device remaining lifetime diagnosis apparatus according to Embodiment 1, and will clearly be explained with reference to FIG. 1.

In FIG. 1, a switching device 1 is provided with a vacuum valve 11 that opens or closes a main circuit, which is an electric circuit configured with main circuit conductors 101 and 102, and an electromagnetic actuator 12, which is a driving mechanism for driving the vacuum valve 11.

The vacuum valve 11 is provided with a case 110 that is kept approximately vacuum; inside the case 110, there are contained a fixed contact 111 for opening or closing the main circuit and a movable contact 112 provided in such a way as to face the fixed contact 111. The fixed contact 111 is connected with one end of the main circuit conductor 101; the movable contact 112 is connected with one end of the main circuit conductor 102 by way of a movable contact supporting shaft 113 and a flexible conductor 114. When as illustrated in FIG. 1, the fixed contact 111 and the movable contact 112 are in contact with each other, an electric current flows in the main circuit conductors 101 and 102 in a direction indicated by an arrow, by way of the fixed contact 111 and the movable contact 112. Inside the case 110 of the vacuum valve 11, a bellows 115 is provided between the circumferential surface of the movable contact supporting shaft 113 and the inner circumferential surface of the case 110. The bellows 115 airtightly seals the inside of the case 110.

The movable contact supporting shaft 113 is slidably supported by a first guide bearing 116 fixed to a through-hole in the case 110, and one end of the movable contact supporting shaft 113 protrudes out of the case 110. One end 1171 of a first movable shaft 117 is coupled with the one end of the movable contact supporting shaft 113 and is slidably supported by a second guide bearing 119 fixed to a through-hole of a gas tank 118; the other end 1172 of the first movable shaft 117 protrudes out of the gas tank 118. An insulating rod 120 is inserted into the first movable shaft 117 and insulates the one end 1171 of the first movable shaft 117 from the other end 1172 thereof. Inside the gas tank 118, there are contained the vacuum valve 11, the flexible conductor 114, parts of the main circuit conductors 101 and 102, part of the first movable shaft 117, and the insulating rod 120; furthermore, there is pressure-enclosed an insulating gas such as an SF6 gas or nitrogen, or dry air for enhancing the insulating performance. The bellows 121 tightly seals the air inside the case 118 in.

The electromagnetic actuator 12 is provided with a yoke 211, a permanent magnet 212, a connecting coil 213, a disconnecting coil 214, a movable part 215, and a second movable shaft 216. The yoke 211 is formed of a magnetic material and is provided with a fixed-contact-side end 2111 and a fixed-contact-opposite-side end 2112. The movable part 215 is formed of a magnetic material, fixed to the second movable shaft 216, and disposed in the inner space of the yoke 211. The second movable shaft 216 is slidably supported by a third guide bearing 217 and a fourth guide bearing 218 provided in the fixed-contact-side end 2111 and the fixed-contact-opposite-side end 2112, respectively, of the yoke 211.

Each of a pair of permanent magnets 212 formed in a tabular shape is fixed to the surface of a protrusion 2113 that projects approximately toward the center of the inner space of the yoke 211. The surface of a pair of permanent magnets 212 faces the movable part 215 through the intermediary of a predetermined gap. The connecting coil 213 is disposed in the inner space of the yoke 211 and is fixed on the fixed-contact-side end 2111 of the yoke 211. The disconnecting coil 214 is disposed in the inner space of the yoke 211 and is fixed on the fixed-contact-opposite-side end 2112 of the yoke 211. The connecting coil 213 and the disconnecting coil 214 are each connected with a driving power source 2 and a driving capacitor 3.

The electromagnetic actuator 12 is actuated by being energized with a driving current from the driving power source 2 and drives the movable contact 112 in the vacuum valve 11 so as to open or close the vacuum valve 11. The driving capacitor 3 is provided in order to supply a necessary amount of driving current when the driving current required by the electromagnetic actuator 12 is larger than the capacity of the driving power source 2.

A contact pressure spring supporting case 219 is fixed to one end 2161 of the second movable shaft 216, and a contact pressure spring 220 is fixed inside the contact pressure spring supporting case 219. The other end 1172 of the first movable shaft 117 is slidably inserted into the contact pressure spring supporting case 219 and always biased toward the fixed contact 111 by the contact pressure spring 220.

Current sensors 41 and 42, which are measurement devices for measuring the performance characteristics of the switching device 1, are provided in the connection circuit between the connecting coil 213 of the electromagnetic actuator 12 and the driving power source 2 and in the connection circuit between the disconnecting coil 214 and the driving power source 2, respectively, and measure the driving currents that flow through the connection circuits. Each of the current sensors 41 and 42 outputs, as an analogue signal or a digital signal, current waveform data on the measured driving current and inputs the data to the status monitoring apparatus 5. Reference numeral 6 denotes a display device, which is a display unit, described later.

From an initial time point when the operation of the switching device 1 is started, the current sensors 41 and 42 measure driving currents for the electromagnetic actuator 12, for example, each time the electromagnetic actuator 12 operates, and outputs the current waveforms of the driving currents that are measured at different time points. The outputs of the current sensors 41 and 42 may be voltage waveforms instead of the current waveforms of driving currents; however, the following explanation will be made under the assumption that the current sensors 41 and 42 output current waveforms.

Figure 2:
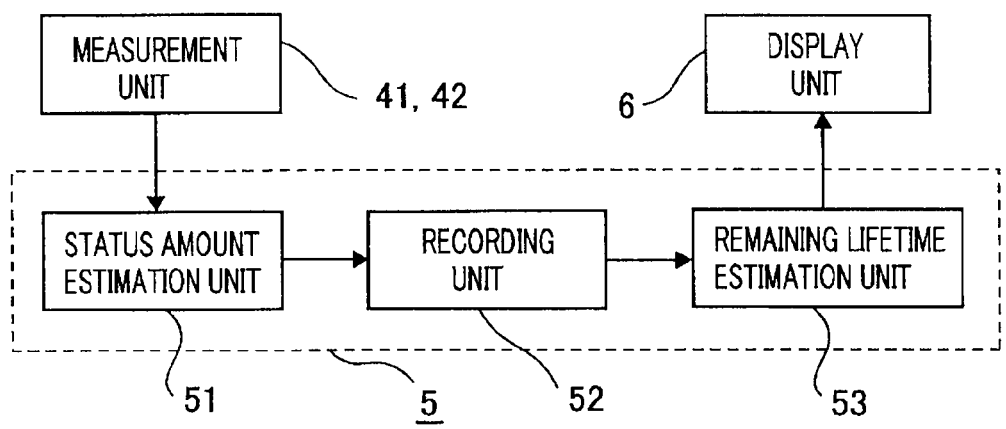
FIG. 2 is a block diagram illustrating the configuration of a status monitoring apparatus in a switching-device remaining lifetime diagnosis apparatus according to Embodiment 1 of the present invention.

FIG. 2 is a block diagram illustrating the configuration of the status monitoring apparatus 5 in the switching-device remaining lifetime diagnosis apparatus according to Embodiment 1 of the present invention. In FIG. 2, the status monitoring apparatus 5 is configured with a status amount estimation unit 51, a recording unit 52, and a remaining lifetime estimation unit 53. The status amount estimation unit 51 receives current waveform data outputted from the current sensors 41 and 42 and, based on the current waveform data, estimates status amounts related to the deterioration status of the switching device 1, i.e., status amounts, such as a contact wear and tear amount, frictional force at a time of driving, and the capacitance of the driving capacitor 3, which specify the deterioration status of the switching device 1.

In general, current waveform data on the driving current for a switching device can be obtained from a waveform corresponding to the driving distance of the movable contact; however, as the contacts wear out, the driving distance of the movable contact of the switching device varies from a preliminarily set driving distance or the driving distance at the time when opening/closing operation has been implemented. Accordingly, the current waveform data obtained during opening/closing operation differs from predetermined data or the data at the time when opening/closing operation has been implemented. Accordingly, by preliminarily obtaining, through an experiment or a calculation, the correspondence relationship among the changing amount of current waveform data, the driving distance of the movable contact, and the wear and tear amount of the contacts, there can be estimated a contact wear and tear amount, which is a status amount related to the deterioration status of the switching device, from the changing amount of the current waveform data. Alternatively, instead of the contact wear and tear amount, the changing amount of the current waveform data can be utilized as a status amount related to the deterioration status of the switching device.

In addition, in general, when a switching device is driven, the driving speed for the switching device or the starting timing of opening/closing operation varies depending on frictional force exerted on the driving shaft. When the driving speed or the starting timing of opening/closing operation varies, the current waveform data obtained during opening/closing operation differs from predetermined data or the data at the time when opening/closing operation has been implemented. Accordingly, by preliminarily obtaining, through an experiment or a calculation, the correspondence relationship between the changing amount of current waveform data and frictional force exerted at a time when the switching device is driven, there can be estimated frictional force exerted at a time when the switching device is driven, which is a status amount related to the deterioration status of the switching device, from the changing amount of the current waveform data. Alternatively, instead of the frictional force, the changing amount of the current waveform data can be utilized as a status amount related to the deterioration status of the switching device.

Additionally, in general, when the switching device is driven, a driving current is discharged from the driving capacitor 3 provided in the driving circuit; when the capacity of the driving capacitor 3 changes, the discharge time constant also changes; therefore, the current waveform data differs from predetermined data or the data at the time when opening/closing operation has been implemented. Accordingly, by preliminarily obtaining, through an experiment or a calculation, the correspondence relationship between the changing amount of current waveform data and the capacity of the driving capacitor 3, there can be estimated the capacity of the driving capacitor 3, which is a status amount related to the deterioration status of the switching device, from the changing amount of the current waveform data. Alternatively, instead of the capacity of the driving capacitor 3, the changing amount of the current waveform data can be utilized as a status amount related to the deterioration status of the switching device.

As described above, the current sensors 41 and 42 measure the driving current two or more times at different time points; thus, based on each of the current waveform data measured two or more times, the status amount estimation unit 51 estimates the foregoing status amount that specifies the deterioration status, of the switching device 1, corresponding to each of the measurement time points.

The recording unit 52 sequentially records, as status amount history data, the status amount, at each measurement time point, estimated by the status amount estimation unit 51. The remaining lifetime estimation unit 53 reads status amount history data recorded in the recording unit 52, diagnoses the development situation of deterioration in the switching device 1, based on the read status amount history data and in such a manner as described later, and estimates the remaining lifetime of the switching device 1 and the deterioration factor that has brought about the deterioration. The value of the remaining lifetime estimated by the remaining lifetime estimation unit 53 and the estimated deterioration factor in the switching device 1 are transmitted to the display device 6, where they are displayed and notified to a maintenance staff.

Next, the operation of the switching device 1 will be explained. When as illustrated in FIG. 1, the vacuum valve 11 is in the connection mode, thereby closing the main circuit consisting of the main circuit conductors 101 and 102, both the connecting coil 213 and the disconnecting coil 214 are de-energized; however, the movable part 215 is held in the connecting position where it adheres to the fixed-contact-side end 2111 of the yoke 211 by the permanent magnet 212. As a result, the movable contact 112 is in contact with the fixed contact 111, through the intermediary of the second movable shaft 216, the contact pressure spring 220, the first movable shaft 117, the insulating rod 120, and the movable contact supporting shaft 113. The contact pressure spring 220 exerts a predetermined contact pressure between the fixed contact 111 and the movable contact 112.

In the case where when the vacuum valve 11 is in the connection mode illustrated in FIG. 1, the driving power source 2 energizes and biases the disconnecting coil 214, the movable part 215 is attracted toward the fixed-contact-opposite-side end 2112 of the yoke 211 by magnetic force generated by the disconnecting coil 214, moves toward the fixed-contact-opposite-side end 2112, and stops at the disconnecting position where it adheres to the fixed-contact-opposite-side end 2112. After that, although the disconnecting coil 214 is de-energized, the movable part 215 is held at the disconnecting position by the magnetic force of the permanent magnet 212. As a result, the movable contact 112 of the vacuum valve 11 is separated from the fixed contact 111, so that the main circuit is shut off.

In contrast, in the case where when the vacuum valve 11 is in the disconnection mode, the driving power source 2 energizes and biases the connecting coil 213, the movable part 215 is attracted toward the fixed-contact-side end 2111 by magnetic force generated by the connecting coil 213, moves toward the fixed-contact-side end 2111, and stops, as illustrated in FIG. 1, at the connecting position where it adheres to the fixed-contact-side end 2111. After that, although the connecting coil 213 is de-energized, the movable part 215 is held at the connecting position by the magnetic force of the permanent magnet 212. As a result, the movable contact 112 of the vacuum valve 11 makes contact with the fixed contact 111, so that the main circuit is closed.

As described above, the movable contact supporting shaft 113, the first movable shaft 117, and the second movable shaft 216 are slidably supported by the first guide bearing 116, the second guide bearing 119, the third guide bearing 217, and the fourth guide bearing 218; therefore, in the case where the switching device 1 performs the disconnection operation or the connection operation, the movable contact supporting shaft 113, the first movable shaft 117, and the second movable shaft 216 usually move in a smooth manner, so that the movable contact 112 of the vacuum valve 11 can be driven.

In general, the respective sliding portions between the movable contact supporting shaft 113, the first movable shaft 117, and the second movable shaft 216 and the first guide bearing 116, the second guide bearing 119, the third guide bearing 217, and the fourth guide bearing 218 are designed in such a way that the product remaining lifetime is satisfied when the switching device 1 is used with a predetermined condition.

However, in the case where the switching device 1 is continuously utilized with a condition exceeding a predetermine condition, deterioration in the respective sliding portions or in the lubricant causes frictional force exerted on each sliding portion to change, whereby operation failure may be caused in the switching device 1. The contributing factors of such deterioration in a sliding portion, i.e., deterioration in a switching device are (1) wear and tear of the sliding portion, (2) roughness in the sliding portion, (3) corrosion in the sliding portion (4) foreign-material invasion in a movable part such as a movable shaft, (5) solidification of lubricant in the sliding portion, and the like. The development of the deterioration in the sliding portion differs depending on the contributing factor, and each contributing factor has its own characteristic.

In other words, the wear and tear of the sliding portion in the switching device 1 develops as the operation of the switching device continues. Accordingly, in the case where the contributing factor of the deterioration in the sliding portion is wear and tear of the sliding portion, the development of the deterioration in the sliding portion largely depends on the number of operations of the switching device 1. The deterioration in the sliding portion continuously develops from its initial state at a time when the switching device 1 starts to operate. The tendency of the development of sliding-portion wear and tear depends on the structure of the sliding portion of the switching device 1, and the effect of the difference among switching devices 1 is relatively small.

In contrast, roughness in the sliding portion of the switching device 1 is produced when due to a certain cause, a scratch is made on the surface of the sliding portion; the scratch on the surface of the sliding portion becomes larger each time the switching device 1 repeats its opening/closing operation. Therefore, although in the case where the contributing factor of deterioration in a sliding portion is roughness in the sliding portion, frictional force exerted when the switching device 1 performs its opening/closing operation increases, as is the case with the foregoing wear and tear of the sliding portion, and the deterioration in the sliding portion develops in proportion to the number of opening/closing operations of the switching device 1, the deterioration in the sliding portion due to the roughness in the sliding portion does not gradually develop from its initial state at a time when the switching device 1 starts to operate, but abruptly starts to develop at a certain time point.

Corrosion in the sliding portion of the switching device 1 is caused by rust in a metal material or chemical change in a polymeric material; the corrosion in the sliding portion enlarges static friction or sliding friction in the sliding portion. Accordingly, in the case where the contributing factor of the deterioration in the sliding portion is corrosion in the sliding portion, the development of the deterioration in the sliding portion mainly depends on the elapsed time from the time point when the switching device 1 has been installed. The development speed of the deterioration largely differs depending on the ambient environment (such as temperature, humidity, or whether or not salt erosion or corrosive gas exists). Furthermore, the development speed of rust in a metal material changes depending on whether the switching device 1 frequently performs its opening/closing operation or performs no opening/closing operation for a long time; thus, how the deterioration in the sliding portion develops differs.

Foreign-material invasion in a movable part such as a movable shaft of the switching device 1 is caused when grit and dust, metallic fragments that have fallen out of the surrounding material, or the like are piled on the movable shaft or the like; due to the foreign-material invasion, the moving part may become unable to move to the right stationary position, or such foreign materials invade in the sliding portion, thereby increasing frictional force exerted on the sliding portion. Foreign-material invasion in the sliding portion may become one of the contributing factors of the foregoing roughness in the sliding portion. In some cases, the change, in the frictional force exerted on the sliding portion, caused by such invasion of grit and dust in the sliding portion abruptly occurs and then is cancelled after the switching device 1 performs its opening/closing operation several times. As described above, in the case where the contributing factor of deterioration in the sliding portion is foreign-material invasion in a movable part such as a movable shaft, in some cases, deterioration in the sliding portion abruptly occurs and then is cancelled after the switching device 1 performs its opening/closing operation several times. Additionally, there appears a tendency in which the more grit and dust are piled, the higher the proportion of fluctuation in frictional force becomes.

On the other hand, when the switching device 1 is not operated for a long time, solidification of lubricant in the sliding portion of the switching device is caused because oil in the lubricant for the sliding portion is separated and then the lubricant solidifies. Such a lubricant solidification phenomenon does not readily develop when the switching device 1 frequently performs its opening/closing operation. Additionally, if the oil of the lubricant has not perfectly been separated, the solidification is eliminated when the switching device 1 performs its opening/closing operation. Accordingly, in the case where the contributing factor of the deterioration in the sliding portion is solidification of the lubricant, frictional force exerted on the sliding portion becomes large at an initial stage when the switching device 1 performs its opening/closing operation after a long inoperative time period; however, after that, there is shown a frictional-force deterioration tendency in which after the opening/closing operation is repeated in a relatively short cycle, the frictional force exerted on the sliding portion is restored to the original state.

Figure 3:
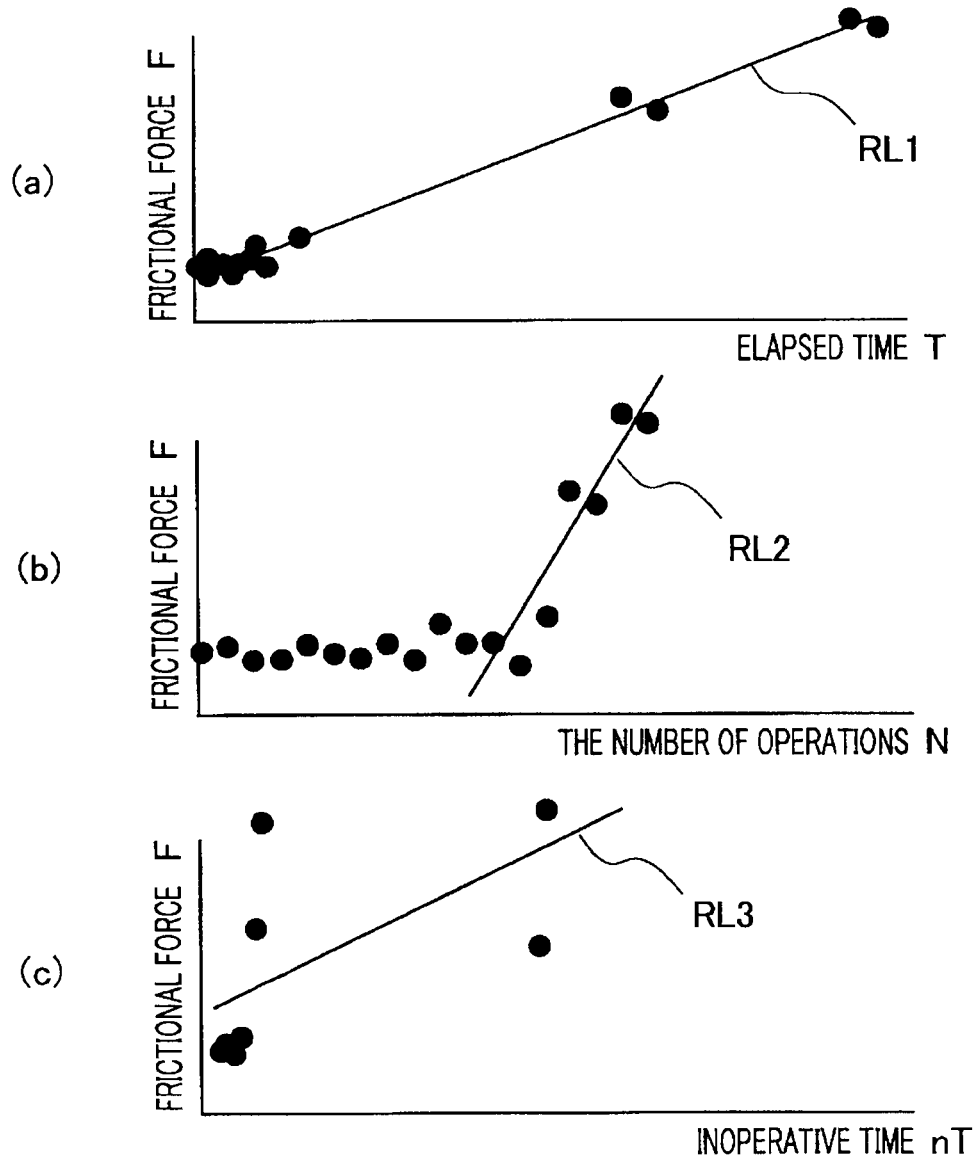
FIG. 3 is a set of graphs representing a case where frictional force caused by corrosion in a sliding portion is rendered as data in three different systems.

FIG. 3 is a set of graphs representing a case where the status amount related to deterioration in the switching device 1, i.e., frictional force F, which is one of the deterioration factors, caused by corrosion in the sliding portion is rendered as data in three different systems, based on status amount history data; (a) is a graph of first system data in which frictional forces F, which are status amounts related to deterioration in a switching device, are sequentially arranged with the abscissa of the elapsed time T during the operation period of the switching device 1; (b) is a graph of second system data in which the frictional forces F are sequentially arranged with the abscissa of the number of operations N during the operation period of the switching device; (c) is a graph of third system data in which the frictional forces F are sequentially arranged with the abscissa of the inoperative time nT during the operation period of the switching device.

It can be seen that in the case where the contributing factor of change in the frictional force F, i.e., the contributing factor of deterioration in the sliding portion is corrosion in the sliding portion, the frictional force F exerted on the sliding portion gradually increases in proportion to the elapsed time T, as is clear from a regression line RL1, of the first system data, represented in (a) of FIG. 3. Because at an initial time point when the switching device 1 starts to operate, the switching device 1 is operated many times for adjustment, there exists a great deal of status amount history data.

In the second system data shown in (b) of FIG. 3, as represented by a regression line RL2, the frictional force F looks like abruptly starting to increase at a certain time point. Accordingly, if the analysis of the frictional force F is implemented based only on the second system data, a large error is made in estimating the remaining lifetime of the switching device 1.

In the third system data shown in (c) of FIG. 3, there can be derived such a regression line as represented by a regression line RL3; however, variation in data with respect to the regression line is large, whereby the correlation is extremely low. Accordingly, if the analysis of the frictional force F is implemented based only on the third system data, a large error is made in estimating the remaining lifetime of the switching device 1.

FIG. 4 is a set of graphs representing a case where frictional force F caused by wear and tear of a sliding portion is rendered as data in three different systems, based on status amount history data; (a) is a graph of first system data in which the frictional forces F are sequentially arranged with the abscissa of the elapsed time T during the operation period of the switching device; (b) is a graph of second system data in which the frictional forces F are sequentially arranged with the abscissa of the number of operations N during the operation period of the switching device; (c) is a graph of third system data in which the frictional forces F are sequentially arranged with the abscissa of the inoperative time nT during the operation period of the switching device.

It can be seen that in the case where the contributing factor of change in the frictional force F, i.e., the contributing factor of deterioration in the sliding portion due to change in the frictional force is corrosion in the sliding portion, the frictional force F exerted on the sliding portion gradually increases in proportion to the number of operations N, as is clear from a regression line RL2, of the second system data, represented in (b) of FIG. 4. In contrast, in the first system data shown in (a) of FIG. 4, as represented by a regression line RL1, there cannot be found any sufficient correlation between the frictional force F and the elapsed time T. Therefore, it is not possible to analyze the change in the frictional force F, based only on the first system data, whereby it is difficult to estimate the remaining lifetime of the switching device 1 from only the first system data.

Similarly, in the third system data shown in (c) of FIG. 4, as represented by the regression line RL3, there cannot be found any sufficient correlation between the frictional force F and the inoperative time nT during the operation period of the switching device. Therefore, it is not possible to analyze the change in the frictional force F, based only on the first system data, whereby it is difficult to estimate the remaining lifetime of the switching device 3 from only the third system data.

Furthermore, FIG. 5 is a set of graphs representing a case where frictional force F caused by the solidification of lubricant is rendered as data in three different systems, based on status amount history data; (a) is a graph of first system data in which the frictional forces F are sequentially arranged with the abscissa of the elapsed time T during the operation period of the switching device; (b) is a graph of second system data in which the frictional forces F are sequentially arranged with the abscissa of the number of operations N during the operation period of the switching device; (c) is a graph of third system data in which the frictional forces F are sequentially arranged with the abscissa of the inoperative time nT during the operation period of the switching device.

It can be seen that in the case where the contributing factor of change in the frictional force F, i.e., the contributing factor of deterioration in the sliding portion due to change in the frictional force is the solidification of lubricant, the longer the inoperative time nT is, the larger the frictional force F exerted on the sliding portion becomes when the opening/closing operation is resumed, as is clear from a regression line RL3, of the third system data, represented in (c) of FIG. 5. In the case where the opening/closing operation is performed after a short inoperative time nT, the frictional force F tends to be restored to the original force. In contrast, in each of the first system data represented in (a) and the second system data represented in (b), variation in the frictional force F exerted on the sliding portion becomes large, whereby it is impossible to analyze the change in the frictional force F; thus, it is difficult to estimate the remaining lifetime of the switching device 1.

As described above, depending on the kind of contributing factor that causes change in the frictional force F, the kind of the abscissa of the system data closely related to the change in the frictional force F differs; therefore, if as the status amount based on measurement data, the frictional force F is rendered only by one of the foregoing three system data pieces, there may occur a case where a tendency of change in the frictional force cannot sufficiently be assessed.

Accordingly, in a switching-device remaining lifetime diagnosis method and a switching-device remaining lifetime diagnosis apparatus according to Embodiment 1 of the present invention, there are created a first system data in which status amounts related to deterioration in a switching device are arranged with the abscissa of the total elapsed time during a period after a time point when the switching device 1 has initially been operated, a second system data in which the foregoing status amount is arranged with the abscissa of the number of total operations of the switching device during the period after the time point when the switching device 1 has initially been operated, and a third system data in which the foregoing status amount is arranged with the abscissa of the total inoperative time of the switching device during the period after the time point when the switching device 1 has initially been operated; based on the created first system data through the third system data, the remaining lifetime of the switching device is estimated.

In the switching-device remaining lifetime diagnosis apparatus according to Embodiment 1 of the present invention, the remaining lifetime estimation unit 53 creates the first system data to the third system data and estimates the remaining lifetime.

Next, the operation of a switching-device remaining lifetime diagnosis apparatus according to Embodiment 1 of the present invention will be explained. In FIG. 1, when the switching device 1 performs disconnection operation, the driving power source 2 biases the disconnecting coil 214 of the electromagnetic actuator 12 so that through the foregoing operation, the movable contact 112 of the vacuum valve 11 is separated from the fixed contact 111 and hence the main circuit is opened. In this situation, the current sensor 42 measures the current waveform of a driving current applied to the disconnecting coil 214 and inputs the measurement data to the status amount estimation unit 51 of the status monitoring apparatus 5 illustrated in FIG. 2.

When the switching device 1 performs connection operation, the driving power source 2 biases the connecting coil 213 of the electromagnetic actuator 12 so that through the foregoing operation, the movable contact 112 of the vacuum valve 11 makes contact with the fixed contact 111 and hence the main circuit is closed. In this situation, the current sensor 41 measures the current waveform of a driving current applied to the connecting coil 213 and inputs the measurement data to the status amount estimation unit 51 of the status monitoring apparatus 5 illustrated in FIG. 2.

Based on change in the current waveform, which is the input measurement data, the status amount estimation unit 51 estimates status amounts, such as a contact wear and tear amount, frictional force at a time of driving, and the capacitance of the driving capacitor 3, which specify the deterioration status of the sliding portion in the switching device 1. The recording unit 52 records and accumulates, as status amount history data, the status amount estimated by the status amount estimation unit 51.

The remaining lifetime estimation unit 53 reads status amount history data recorded in the recording unit 52; firstly, based on the status amount history data, the remaining lifetime estimation unit 53 creates a first system data in which the status amounts are sequentially arranged with the abscissa of the elapsed time T from a time point when the switching device 1 has initially been operated, a second system data in which the status amounts are arranged with the abscissa of the number of operations N from a time point when the switching device 1 has initially been operated, and a third system data in which the status amounts are arranged with the abscissa of the inoperative time nT from a time point when the switching device 1 has initially been operated; then, the remaining lifetime estimation unit 53 estimates the remaining lifetime of the switching device 1, based on at least one of the system data pieces. The following explanation will be made by utilizing, as the status amount, the frictional force F exerted on the sliding portion; however, it goes without saying that another status amount can be utilized.

Additionally, the remaining lifetime estimation unit 53 preliminarily prepares four remaining lifetime variables t1, t2, t3, and t4; a large value, for example, "999 years" is set for each of the variables t1, t2, t3, and t4. The values of the variables t1, t2, t3, and t4 are rewrited by remaining lifetime estimation values, described later.

Figure 6A:
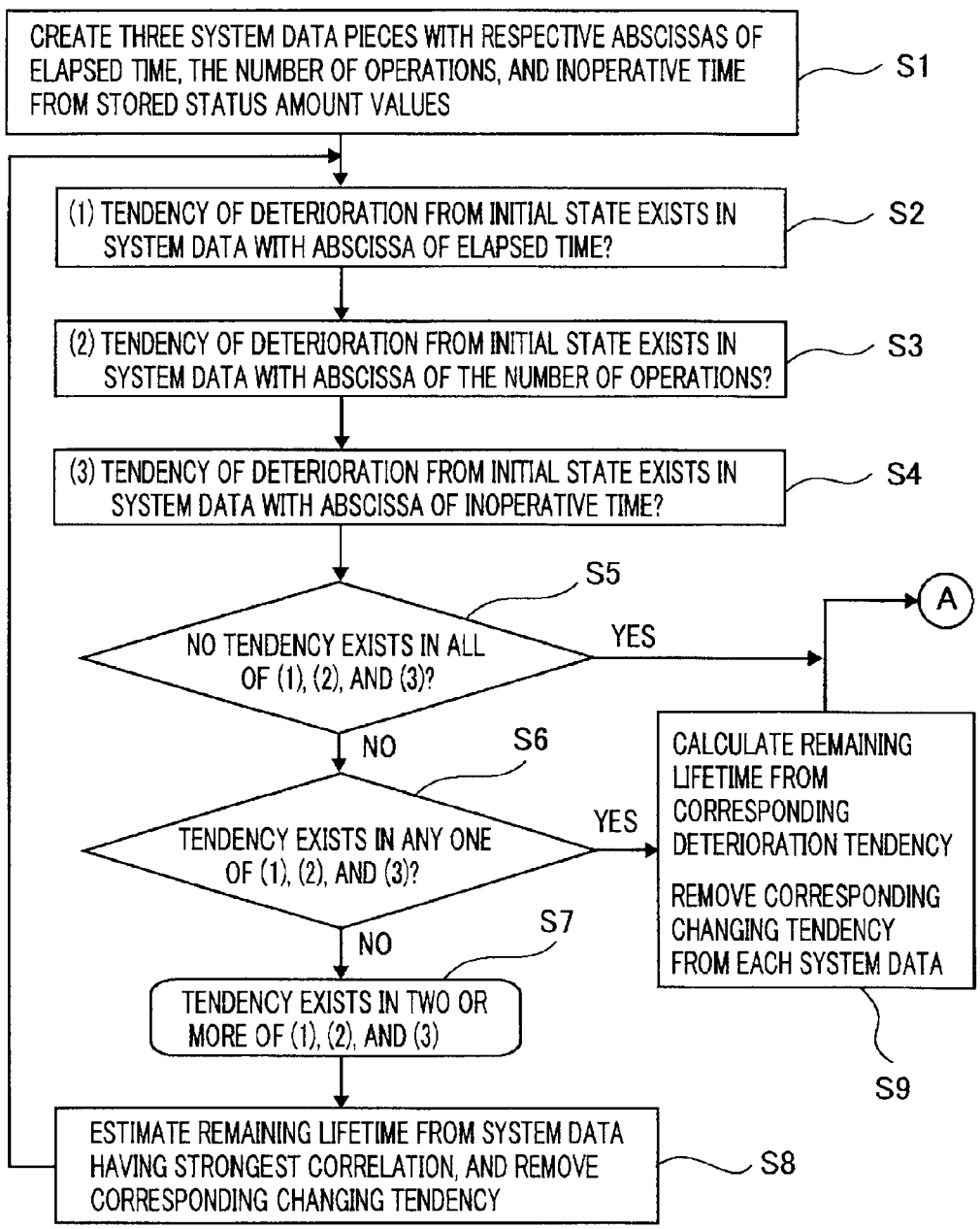
FIGS. 6A and 6B are a set of flowcharts for explaining the operation of a switching-device remaining lifetime diagnosis apparatus according to Embodiment 1 of the present invention.
Figure 6B:
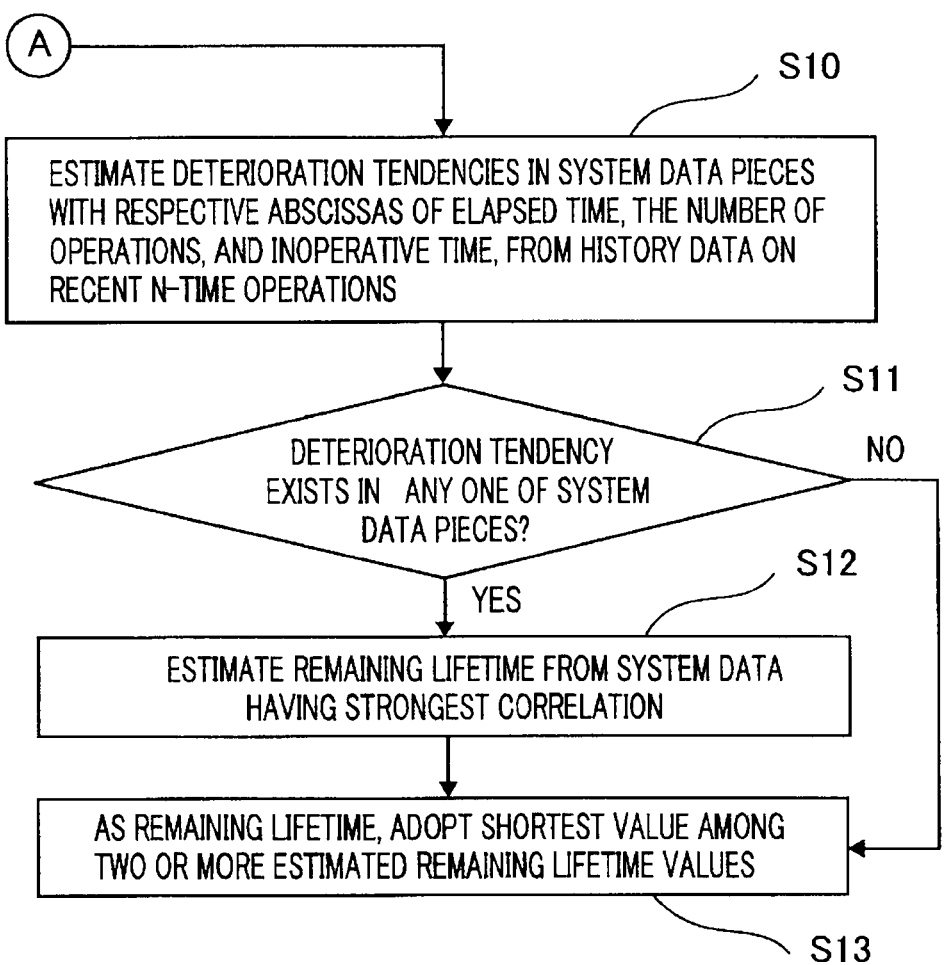

FIGS. 6A and 6B are a set of flowcharts for explaining the operation in which the remaining lifetime estimation unit 53 of the status monitoring apparatus 5 estimates the remaining lifetime of the switching device 1 by determining, from the foregoing first system data to third system data, the deterioration tendency of the frictional force exerted on the switching device 1.

In FIG. 6A, at first, in the step S1, all the status amount history data recorded in the recording unit 52 of the status monitoring apparatus 5 is read; then, there is rendered the first system data in which the frictional forces F, which are status amounts in the read status amount history data, are arranged with the abscissa of the elapsed time T during a period after a time point when the switching device 1 has initially started to operate. The elapsed time first system data corresponds to the first system data represented in (a) of FIG. 3, (a) of FIG. 4, or (a) of FIG. 5, described above.

Moreover, in the step S1, there is rendered the second system data in which the frictional forces F, which are status amounts in the read status amount history data, are arranged with the abscissa of the number of operations N of the switching device 1 during a period after a time point when the switching device 1 has initially started to operate. The second system data corresponds to the second system data represented in (b) of FIG. 3, (b) of FIG. 4, or (b) of FIG. 5, described above.

Furthermore, in the step S1, there is created the third system data in which the frictional forces F, which are status amounts in the read status amount history data, are arranged with the abscissa of the inoperative time nT of the switching device 1 during a period after a time point when the switching device 1 has initially started to operate. The third system data corresponds to the third system data represented in (c) of FIG. 3, (c) of FIG. 4, or (c) of FIG. 5, described above.

Next, in the step S2, it is determined whether or not in the first system data, there is recognized a tendency in which the frictional force F at a time when the switching device 1 initially starts to operate is deteriorated as the elapsed time T increases. In the determination implemented in the step S2, in the case where as represented in (a) of FIG. 3 or in (a) of FIG. 4, a regression line RL1 is obtained, when the correlation coefficient of the regression line RL1 is the same as or larger than a predetermined value and the gradient of the regression line RL1 is the same as or smaller than a predetermined value (or the same as or larger than a predetermined value), it is determined that the deterioration tendency of the frictional force F is recognized; in other cases, it is determined that the deterioration tendency of the frictional force F is not recognized.

Next, in the step S3, it is determined whether or not in the second system data, there is recognized a tendency in which the frictional force F at a time when the switching device 2 initially starts to operate is deteriorated as the number of operations N increases. In the determination implemented in the step S3, in the case where as represented in (b) of FIG. 3 or in (b) of FIG. 4, a regression line RL2 is obtained, when the correlation coefficient of the regression line RL2 is the same as or larger than a predetermined value and the gradient of the regression line RL2 is the same as or smaller than a predetermined value (or the same as or larger than a predetermined value), it is determined that the deterioration tendency of the frictional force F is recognized; in other cases or in the case where as represented in (b) of FIG. 5, no regression line is obtained, it is determined that the deterioration tendency of the frictional force F is not recognized.

Next, in the step S4, it is determined whether or not in the third system data, there is recognized a tendency in which the frictional force F at a time when the switching device 1 initially starts to operate is deteriorated as the inoperative time nT of the switching device 1 increases. In the determination implemented in the step S4, in the case where as represented in (c) of FIG. 5, a regression line RL3 is obtained, when the correlation coefficient of the regression line RL3 is the same as or larger than a predetermined value and the gradient of the regression line RL3 is the same as or smaller than a predetermined value (or the same as or larger than a predetermined value), it is determined that the deterioration tendency of the frictional force F is recognized; in other cases or in the case where as represented in (c) of FIG. 3 and (c) of FIG. 4, no regression line is obtained, it is determined that the deterioration tendency of the frictional force F is not recognized.

In this explanation, as a curve that shows data correlation, a regression line is utilized; however, a high-order regression curve, a regression curve utilizing an exponent, or a regression curve utilizing a logarithm may be adopted. Moreover, in this explanation, correlation coefficients are utilized, it may be allowed that the difference (or the absolute value of the difference) between the data and the regression line is utilized and it is adopted, as a determination condition, that this difference is smaller than a predetermined value.

Next, in the step S5, it is determined whether or not in all the results of the determinations implemented in the steps S2, S3, and S4, there is recognized, in the frictional force F, no tendency of deterioration in the switching device 1 from the initial state thereof; in the case where in all the results of the determinations implemented in the steps S2, S3, and S4, there is recognized, in the frictional force F, no deterioration tendency (YES), the step S5 is followed by the step S10, described later; in the case where in at least one of the results of the determinations implemented in the steps S2, S3, and S4, there is recognized a deterioration tendency in the frictional force F (NO), the step S5 is followed by the step S6.

In the step S6, it is determined whether or not in only one of the results of the determinations implemented in the steps S1, S2, and S3, there is recognized a deterioration tendency in the frictional force F; in the case where it is determined that in only one of the system data pieces, there exists a deterioration tendency in the frictional force F (YES), the step S6 is followed by the step S9; in the case where it is determined that in two or more system data pieces, there exist deterioration tendencies (NO), the step S6 is followed by the step S7.

In the case where in the steps described above, it is determined that in two or more system data pieces among the results of the determinations implemented in the steps S1, S2, and S3, there is recognized a tendency in which the frictional force F is deteriorated, the flow of the flowchart passes through the step S7; then, the step S7 is followed by the step S8. In the step S8, the estimation value of the remaining lifetime of the switching device 1 is calculated from the system data, among two or more system data pieces in which the deterioration tendency of the frictional force F is recognized, which has the largest correlation coefficient of a regression line.

Case 1

Here, at first, as Case 1, explanation will be made assuming a case where it is determined in the step S2 that the frictional force F in the first system data has a deterioration tendency, it is determined in the step S3 that the frictional force F in the second system data has a deterioration tendency, and it is determined in the step S4 that the frictional force F in the third system data has a deterioration tendency. In addition, in Case 1, it is assumed that the first system data has the strongest correlation.

In Case 1, the result of the determination in the step S5 becomes "NO"; then, the step S5 is followed by the step S6. In the step S6, it is determined whether or not in only one of the results of the determinations implemented in the steps S1, S2, and S3, there is recognized a tendency in which the frictional force F is deteriorated; thus, the result becomes "NO", and then the step S6 is followed by the step S7. In the step S7, in the case where it is determined that in two or more system data pieces in the results of the determinations implemented in the steps S1, S2, and S3, there is recognized a tendency in which the frictional force F is deteriorated, the flow of the flowchart advances to the step S8; thus, in Case 1, the step S7 is followed by the step S8.

In the step S8, for the first system data that has the strongest correlation among the three system data pieces, an optimum regression line RL1 is obtained; then, from this regression line, there is calculated an elapsed time in which the frictional force F reaches the limit value with which the switching device 1 cannot satisfy predetermined performance any more. The calculated elapsed time is converted into the number of years; the number of years rewrites the value "999" of the foregoing variable t1 that has been preliminarily prepared; then, the number of years is utilized as a first estimation value for the remaining lifetime. In this situation, in the case where the value obtained by converting the calculated elapsed time into the number of years exceeds "999", the first estimation value is set to "999".

Next, in the step S8, the deterioration tendency of the frictional force F in the first system data, which has the strongest correlation, is removed from the original data; then, three system data, i.e., the first system data to the third system data are created again. For example, the procedure of removing the deterioration tendency from the original data is as follows:

(1) The three system data pieces can be represented by ($y\_i$, $a\_i$, $b\_i$, $c\_i$). The character i denotes a value that varies from 1 to M; M denotes the number of total data pieces; $y\_i$ corresponds to the measured status amount; $a\_i$ corresponds to the elapsed time, which is the abscissa of the first system data; $b\_i$ corresponds to the number of operations, which is the abscissa of the second system data; $c\_i$ corresponds to the inoperative time, which is the abscissa of the third system data.

(2) With regard to each of the first system data ($y\_i$, $a\_i$) the second system data ($y\_i$, $b\_i$), and the third system data ($y\_i$, $c\_i$), for example, the deterioration tendency of the frictional force F is determined.

(3) For example, in the case where a significant deterioration tendency of the frictional force F is recognized in the first system data ($y\_i$, $a\_i$), there is obtained a regression line [$y = A \times a + B$]. Here, A and B denote coefficients obtained by use of a correlation coefficient acquired through statistic calculation of the system data pieces.

(4) Thus, in order to remove, from the original status amount history data, the first system data ($y\_i$, $a\_i$) in which there is recognized the significant deterioration tendency, [($y1\_i$) = ($y\_i$) − ($A \times a\_i$) − B] is set and ($y\_i$, $a\_i$, $b\_i$, $c\_i$) is replaced by ($y1\_i$, $a\_i$, $b\_i$, $c\_i$). As a result, the first system data ($y1\_i$, $a\_i$), the second system data ($y1\_i$, $b\_i$), and the third system data ($y1\_i$, $c\_i$) are newly obtained.

In such a manner as described above, from the original data that has the strongest correlation and from which the deterioration tendency has been removed, there are created again the first system data in which the frictional force is arranged with the abscissa of the elapsed time, the second system data in which the frictional force is arranged with the abscissa of the number of operations, and the third system data in which the frictional force is arranged with the abscissa of the inoperative time. In order to determine whether or not the deterioration tendency of the frictional force is recognized again in the re-created three system data pieces, the steps S2, S3, and S4 are resumed; in the same manner as described above, with regard to each system data, it is determined whether or not there is recognized a tendency in which the frictional force F is deteriorated from the initial state at a time when the switching device 1 starts to operate.

As described above, in Case 1, there is recognized the deterioration tendency of the frictional force F in each of the original system data pieces; however, because through the foregoing procedure, there is removed the deterioration tendency of the frictional force F in the first system data with the abscissa of the elapsed time, which is the system data having the strongest correlation, the deterioration tendency of the frictional force exists in the second system data with the abscissa of the number of operations and the third system data with the abscissa of the inoperative time among the re-created three system data pieces; thus, the steps S5 through S7 are followed by the step S8.

In the step S8, in the same manner as described above, for the system data that has the strongest correlation among the re-created second system data and third system data, an optimum regression line is obtained; then, from this regression line, there is calculated an elapsed time, the number of operations, or an inoperative time in which the frictional force F reaches the limit value with which the switching device 1 cannot satisfy predetermined performance any more. In this situation, provided the re-created second system data has the strongest correlation, based on the optimum regression line RL2 therefor, there is calculated the particular number of operations, in the time corresponding to which, the frictional force reaches a limit value with which the switching device 1 cannot satisfy predetermined performance any more. The calculated number of operations is converted into the number of years; the number of years rewrites the value "999" of the foregoing variable t2 that has been preliminarily prepared; then, the number of years is utilized as a second estimation value for the remaining lifetime. In this situation, in the case where the value obtained by converting the calculated elapsed time into the number of years exceeds "999", the first estimation value is set to "999".

Next, in the step S8, the deterioration tendency of the frictional force F in the second system data is removed from the original data in the same procedure as described above, and then three system data pieces are newly created.

In order to determine whether or not the deterioration tendency is recognized again in the three system data pieces that are re-created again, the steps S2, S3, and S4 are resumed; in the same manner as described above, with regard to each system data, it is determined whether or not there is recognized a tendency in which the frictional force F is deteriorated from the initial state at a time when the switching device 1 starts to operate. As described above, in Case 1, there is recognized the deterioration tendency of the frictional force F in each of the original system data pieces. Accordingly, because through the foregoing procedure, there are removed the deterioration tendency of the frictional force F in the first system data with the abscissa of the elapsed time and the second system data with the abscissa of the number of operations, the deterioration tendency of the frictional force F exists only in the third system data with the abscissa of the inoperative time among the three system data pieces that are re-created again; thus, the steps S5 and S6 are followed by the step S9.

In the step S9, for the third system data among the three system data pieces that are re-created again, an optimum regression line RL3 is obtained; then, from this regression line, there is calculated an inoperative time in which the frictional force F reaches the limit value with which the switching device 3 cannot satisfy predetermined performance any more. The calculated inoperative time is converted into the number of years; the number of years rewrites the value "999" of the foregoing variable t3 that has been preliminarily prepared; then, the number of years is utilized as a third estimation value for the remaining lifetime. In this situation, in the case where the value obtained by converting the calculated elapsed time into the number of years exceeds "999", the first estimation value is set to "999".

As described above, in Case 1, by repeating three times the process including the steps S2 through S9, the first estimation value t1 and the second estimation value t2 of the remaining lifetime are calculated in the step S8, and the third estimation value t3 is calculated t3 in the step S9.

Next, in the step S9, the deterioration tendency of the frictional force F in the re-created third system data is removed again from the original data in the same procedure as described above, and then the step S9 is followed by the step S10.

In the step S10, there is extracted status amount history data based on the recent N-time measurement data from the data that passed through the step S9, and based on the status amount history data, there are created a fourth system data in which the frictional forces F are arranged with the abscissa of the elapsed time T, a fifth system data in which the frictional forces F are arranged with the abscissa of the number of operations N of the switching device 1, and a sixth system data in which the frictional forces F are arranged with the abscissa of the inoperative time nT of the switching device 1.

The recent N-time measurement data denotes data measured during a period after a time point when a predetermined period has elapsed from a time point when the switching device 1 had started to operate. Thus, the fourth system data denotes system data in which status amounts are arranged in accordance with an elapsed time during a period after a time point when a predetermined period has elapsed from a time point when the switching device 1 had started to operate; the fifth system data denotes system data in which status amounts are arranged in accordance with the number of operations N of the switching device during a period after a time point when a predetermined period has elapsed from a time point when the switching device 1 had started to operate; the sixth system data denotes system data in which status amounts are arranged in accordance with an inoperative time of the switching device during a period after a time point when a predetermined period has elapsed from a time point when the switching device 1 had started to operate.

As the manners in which deterioration in the sliding portion of the switching device 1 appears, there exist a case where deterioration gradually appears from an initial stage where the switching device 1 starts to operate and a case where as represented in (b) of FIG. 3, deterioration rapidly appears at a certain time point. In the latter case, deterioration relatively rapidly develops from a certain time point; the measurement-data analysis performed from an initial stage where the switching device 1 starts to operate cannot readily grasp the deterioration tendency. For example, in the case where there exist a great number of data pieces that do not vary largely and there exist relatively few data pieces that indicate a variation tendency, the measurement-data analysis performed from an initial stage where the switching device 1 starts to operate cannot readily grasp the deterioration tendency. In this situation, by analyzing the recent N-time measurement data, it is made possible to conspicuously determine a deterioration tendency of the switching device 1.

As is the case with the foregoing steps S2, S3, and S4, there are obtained respective regression lines for the fourth system data, the fifth system data, and the sixth system data based on the recent N-time measurement data configured in the step S10; in the case where a regression line is obtained, when the correlation coefficient of the regression line is the same as or larger than a predetermined value and the gradient of the regression line is the same as or smaller than a predetermined value (or the same as or larger than a predetermined value), it is determined that the deterioration tendency of the frictional force F is recognized.

Next, in the step S11, it is determined whether or not in at least one of the fourth system data, the fifth system data, and the sixth system data, there exists a deterioration tendency of the frictional force F, as a status amount; in the case where in at least one of the system data pieces, there exists a deterioration tendency of the frictional force F, as a status amount (YES), the step S11 is followed by the step S12; in the case where in none of the system data pieces, there exists a deterioration tendency of the frictional force F (NO), the step S11 is followed by the step S13.

In the step S12, based on the optimum regression line of the system data, among the three system data pieces in which the deterioration tendency of the frictional force exists, that has the strongest correlation, there is calculated the elapsed time, the number of operations, or the inoperative time, in the time corresponding to which, the frictional force reaches a limit value with which the switching device 1 cannot satisfy predetermined performance any more. For example, provided the fourth system data has the strongest correlation, based on the optimum regression line RL1 therefor, there is calculated an elapsed time in which the frictional force reaches a limit value with which the switching device 1 cannot satisfy predetermined performance any more. The calculated elapsed time is converted into the number of years; the number of years rewrites the value "999" of the foregoing variable t4 that has been preliminarily prepared; then, the number of years is utilized as a fourth estimation value for the remaining lifetime. In this situation, in the case where the value obtained by converting the calculated elapsed time into the number of years exceeds "999", the first estimation value is set to "999".

Next, in the step S13, among the first estimation value t1 and the second estimation value t2 calculated in the step S8, the third estimation value t3 calculated in the step S9, and the fourth estimation value t4 estimated in the step S12, the shortest estimation value is estimated as the remaining lifetime of the switching device 1.

Case 2

Next, as Case 2, there will be explained a case where in two of the steps S2, S3, and S4, it is determined that there exists a deterioration tendency of the frictional force F in the system data.

In Case 2, there exists a deterioration tendency of the frictional force F in two of the three system data pieces; as is the case with Case 1, the flow of the flowchart advances from the step S1 to the step S8 by way of the process including the steps S2, S3, S4, S5, S6, and S7.

In the step S8, for the system data that has the strongest correlation among the two system data pieces, an optimum regression line is obtained; then, from this regression line, there is calculated an elapsed time, the number of operations, or an inoperative time in which the frictional force F reaches the limit value with which the switching device 1 cannot satisfy predetermined performance any more. Provided the first system data has the strongest correlation, based on the optimum regression line RL1 therefor, there is calculated an elapsed time in which the frictional force reaches a limit value with which the switching device 1 cannot satisfy predetermined performance any more. The calculated elapsed time is converted into the number of years; the number of years rewrites the value "999" of the foregoing variable t1 that has been preliminarily prepared; then, the number of years is utilized as a first estimation value for the remaining lifetime. In this situation, in the case where the value obtained by converting the calculated elapsed time into the number of years exceeds "999", the first estimation value is set to "999".

Next, in the step S8, based on the foregoing procedure, the deterioration tendency of the frictional force F in the first system data, which has the strongest correlation, is removed from the original data; then, three system data pieces are re-created. In order to determine whether or not the deterioration tendency is recognized again in the re-created three system data pieces, the steps S2, S3, and S4 are resumed; in the same manner as described above, with regard to each system data, it is determined whether or not there is recognized a tendency in which the frictional force F is deteriorated from the initial state at a time when the switching device 1 starts to operate.

As described above, in Case 2, there is recognized the deterioration tendency of the frictional force F in two of the three original system data pieces; however, because through the foregoing procedure, there has been removed the deterioration tendency of the frictional force F in the first system data, which has the strongest correlation, the deterioration tendency of the frictional force F exists only in the second system data or the third system data among the re-configured three system data pieces; thus, the flow of the flowchart advances to the step S9 by way of the steps S5 and S6.

Provided there exists the deterioration tendency of the frictional force F in the second system data with the abscissa of the number of operations, in the step S9, an optimum regression line RL2 is obtained for the re-created second system data, and then, from this regression line, there is calculated the number of operations in which the frictional force F reaches the limit value with which the switching device 1 cannot satisfy predetermined performance any more. The calculated number of operations is converted into the number of years; the number of years rewrites the value "999" of the foregoing variable t2 that has been preliminarily prepared; then, the number of years is utilized as a second estimation value for the remaining lifetime. In this situation, in the case where the value obtained by converting the calculated elapsed time into the number of years exceeds "999", the first estimation value is set to "999".

As described above, in Case 2, by repeating twice the process including the steps S2 through S9, the first estimation value t1 and the second estimation value t2 of the remaining lifetime are calculated in the step S8 and the step S9, respectively.

Next, in the step S9, the deterioration' tendency of the frictional force F in the re-created second system data is removed from the original data in the same procedure as described above, and then the step S9 is followed by the step S10.

The operation in the process from the step S10 through the step S13 is the same as that in Case 1, described above; there are created the fourth system data, the fifth system data, and the sixth system data based on the recent N-time measurement data, and from the system data that has the strongest correlation, a third estimation value t3 of the remaining lifetime is calculated.

Next, in the step S13, among the first estimation value t1 calculated in the step S8, the second estimation value t2 calculated in the step S9, and the third estimation value t3 calculated in the step S12, the shortest estimation value is estimated as the remaining lifetime of the switching device 1.

Case 3

Next, as Case 3, there will be explained a case where in only one of the steps S2, S3, and S4, for example, in only the first system data, it is determined that there exists a deterioration tendency of the frictional force F.

In Case 3, there exists the deterioration tendency of the frictional force F in only one of the three system data pieces; thus, the flow of the flowchart advances from the step S1 to the step S6 by way of the process including the steps S2, S3, S4, and S5; then, the step S6 is followed by the step S9. In the step S9, for the first system data with the abscissa of the elapsed time, an optimum regression line RL1 is obtained; then, from this regression line, there is calculated an elapsed time in which the frictional force F reaches the limit value with which the switching device 1 cannot satisfy predetermined performance any more. The calculated elapsed time is converted into the number of years; the number of years rewrites the value "999" of the foregoing variable t1 that has been preliminarily prepared; then, the number of years is utilized as a first estimation value for the remaining lifetime. In this situation, in the case where the value obtained by converting the calculated elapsed time into the number of years exceeds "999", the first estimation value is set to "999".

As described above, in Case 3, the step S6 is directly followed by the step S9 so that the first estimation value t1 is calculated.

Next, in the step S9, the deterioration tendency of the frictional force F in the first system data is removed from the original data in the same procedure as described above, and then the step S9 is followed by the step S10.

The operation in the process from the step S10 through the step S13 is the same as that in Case 1 or Case 2, described above; there are created the fourth system data, the fifth system data, and the sixth system data based on the recent N-time measurement data, and from the system data that has the strongest correlation, a second estimation value t2 of the remaining lifetime is calculated.

Next, in the step S13, out of the first estimation value t1 calculated in the step S9 and the second estimation value t2 calculated in the step S12, the shortest estimation value is estimated as the remaining lifetime of the switching device 1.

Case 4

Next, as Case 4, there will be explained a case where in none of the steps S2, S3, and S4, it is determined that there exists a deterioration tendency of, for example, the frictional force F as a status amount. In Case 4, the step S5 is directly followed by the step S10. The operation in the process from the step S10 through the step S13 is the same as that in Case 1, Case 2, or Case 3 described above; based on the recent N-time measurement data, there are configured the fourth system data with the abscissa of the elapsed time, the fifth system data with abscissa of the number of operations, and the sixth system data with the abscissa of the inoperative time, and from the system data that has the strongest correlation, a first estimation value t1 of the remaining lifetime is calculated.

As described above, in Case 4, as the remaining lifetime of the switching device 1, only the first estimation value t1 is calculated, and in the step S13, the first estimation value is estimated as the remaining lifetime of the switching device 1.

In each of Case 1, Case 2, and Case 3, in the process from the steps S10 through S13, the estimation value of a remaining lifetime has been calculated based on the recent N-time measurement data pieces; however, there may be a case where even when the fourth system data, the fifth system data, and the sixth system data are configured based on the recent N-time measurement data, there exists no system data indicating the deterioration tendency of a status amount. In this case, when in none of the first system data through the third system data, there exists no data indicating the deterioration tendency of a status amount, no estimation value of the remaining lifetime is calculated; thus, "999 years" that has been set in each of the variables t, t1, t2, t3, and t4 is the remaining lifetime, and it suggests that because no deterioration tendency has appeared in the switching device 1, the present stage is not for estimating the remaining time.

Next, in each of Cased 1 through 4, in the step S13, from the system data based on which the shortest estimation value of the remaining lifetime has been calculated, the contributing factor of the deterioration in the switching device 1 is estimated. In the step S13, the deterioration factor is estimated in the following manner:

(1) In the case where the remaining lifetime is calculated from the system data with the abscissa of the elapsed time, it is estimated that the deterioration has been caused by rust or corrosion in the sliding portion or by dust piled on the sliding portion.

(2) In the case where the remaining lifetime is calculated from the system data with the abscissa of the number of operations, it is estimated that the deterioration has been caused by wear and tear in the sliding portion.

(3) In the case where the remaining lifetime is calculated from the system data with the abscissa of the inoperative time, it is estimated that the deterioration has been caused by solidification of the lubricant.

In a switching-device remaining lifetime diagnosis method and a switching-device remaining lifetime diagnosis apparatus according to Embodiment 1 of the present invention, there are created a first system data in which status amounts related to deterioration in a switching device are arranged with the abscissa of the total elapsed time during a period after a time point when the switching device 1 has initially been operated, a second system data in which the foregoing status amounts are arranged with the abscissa of the number of total operations of the switching device during the period after the time point when the switching device 1 has initially been operated, and a third system data in which the foregoing status amounts are arranged with the abscissa of the total inoperative time of the switching device during the period after the time point when the switching device 1 has initially been operated; based on the created first system data through the third system data, the remaining lifetime of the switching device is estimated. As a result, the remaining lifetime of the switching device can accurately be estimated, and the contributing factor of deterioration in the switching device can also be estimated.

Embodiment 2

FIG. 7 is a set of explanatory charts for explaining a switching-device remaining lifetime diagnosis method and a switching-device remaining lifetime diagnosis apparatus according to Embodiment 2 of the present invention; (a) is an explanatory chart for explaining a system data in which frictional forces F are arranged with the abscissa of the number of operations or the elapsed time during a period after the switching device has initially started to operate; (b) is an explanatory chart for explaining a system data in which the variance value D of the recent N-time frictional forces is arranged with the abscissa of the number of operations or the elapsed time.

In the system data represented in (a) of FIG. 7, there is recognized no correlation indicating the development of deterioration in the switching device; however, in some times, there exists a case where compared to the variation B1 in the frictional forces F in the initial operation period of the switching device, there becomes large the variation B2 in the frictional forces F at a time when the time has elapsed or the number of operations has increased. It can be estimated that roughness on the surface of the sliding portion or invasion of foreign materials into the sliding portion causes the operation of the switching device to be unstable.

In this case, there are created respective system data pieces in which the variance value of status amounts of N-time operations of the switching device are arranged with the abscissa of the elapsed time, the number of operations of the switching device, the inoperative time of the switching device, and the accumulated operation time of the switching device, and based on these system data pieces, the strength of the correlation of the deterioration in the switching device is determined, so that the remaining lifetime of the switching device can be estimated. Instead of the variance value, the standard deviation, which is similar to the variance value, may be utilized.

Accordingly, in a switching-device remaining lifetime diagnosis method and a switching-device remaining lifetime diagnosis apparatus according to Embodiment 2 of the present invention, there are created a first system data in which the variance value of the status amounts in each predetermined number of measurements by a measurement unit is disposed in accordance with the elapsed time during the operation period of the switching device, a second system data in which the foregoing variance value is disposed in accordance with the number of operations of the switching device during the operation period, a third system data in which the foregoing variance value is disposed in accordance with the inoperative time of the switching device during the operation period, and a fourth system data in which the foregoing variance value is disposed in accordance with the accumulated operation time of the switching device during the operation period; then, based on the created system data pieces, the remaining lifetime of the switching device is estimated. For simplicity, the explanation will be made by use of the first system data through the third system data.

In the system data represented in (a) of FIG. 7, during the initial operation period of the switching device 1, the frictional forces f1, f2, f3, f4, f5, f6, f7, and f8 are dispersed; there is obtained the variance value d1 of the frictional forces f1, f2, f3, f4, f5, f6, and f7 corresponding to 7-time operations of the switching device 1, and then, there is obtained the variance value d2 of the frictional forces f2, f3, f4, f5, f6, f7, and f8 corresponding to the following 7-time operations. Similarly hereinafter, there is sequentially obtained the variance value of each group of frictional forces corresponding to 7-time operations of the switching device until this process reaches the recent number of operations or the elapsed time.

By arranging the variance values D, obtained in such a manner as described above, with the abscissa of the number of operations of the switching device or the elapsed time, a system data represented in (b) of FIG. 7 is obtained. In the system data represented in (b), a clear regression line RL4 can be obtained, whereby the remaining lifetime of the switching device 1 can be estimated.

In the system data represented in (b) of FIG. 7, there are represented only the first system data with the abscissa of the number of operations and the second system data with the abscissa of the elapsed time; however, the third system data with the abscissa of the inoperative time of the switching device can be obtained in a similar manner.

According to Embodiment 2 of the present invention, in the flowchart of FIG. 6A, in the step S1, there are created a first system data in which the variance values D of the frictional forces are arranged with the abscissa of the elapsed time during the operation period of the switching device, the second system data in which the variance values D of the frictional forces are arranged with the abscissa of the number of operations of the switching device, and the third system data in which the variance values D of the frictional forces are arranged with the abscissa of the inoperative time of the switching device; after that, in the steps S2 through S9, through the operation similar to that in Embodiment 1, estimation values t1, t2, and t3 of the remaining lifetime of the switching device 1 are calculated, and in the step S13, the shortest estimation value out of the calculated estimation values of the remaining lifetime is estimated as the remaining lifetime of the switching device 1. In addition, in the case of Embodiment 2, the steps S10 through S12 are not required.

In the case of Embodiment 2, it can be estimated that as described above, roughness on the surface of the sliding portion or intrusion of foreign materials into the sliding portion is the contributing factor of deterioration in the switching device 1.

The switching-device remaining lifetime diagnosis apparatus according to Embodiment 2 makes it possible to diagnose the development of deterioration and estimate the remaining lifetime even in the case where the deterioration factor does not appear in any of the system data in which the measured status amounts are arranged with the abscissa of the time, the data system in which the measured status amounts are arranged with the abscissa of the number of operations, the system data in which the measured status amounts are arranged with the abscissa of the inoperative time, and the system data in which the measured status amounts are arranged with the abscissa of the accumulated operation time.

Embodiment 3

Figure 8:
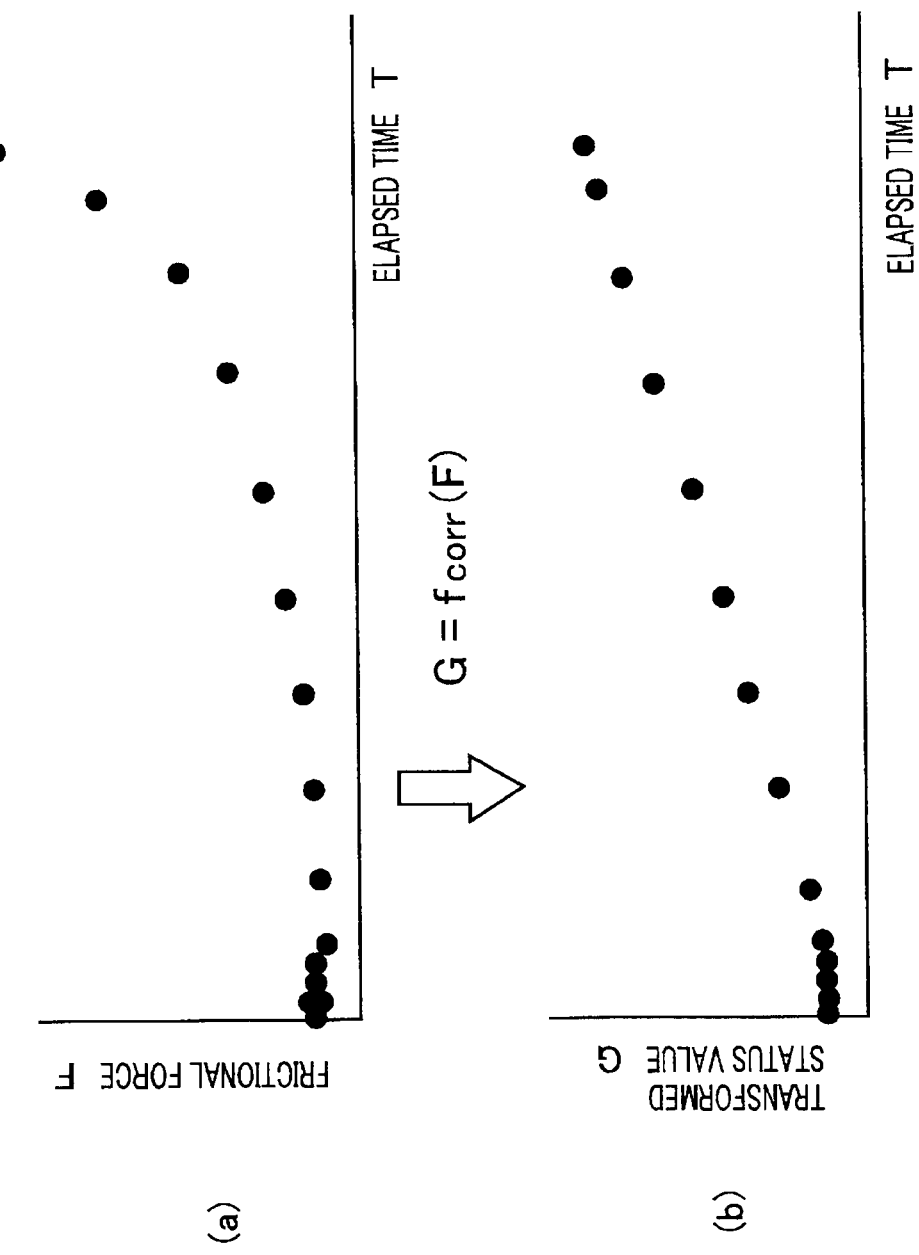
FIG. 8 is a set of explanatory charts for explaining a switching-device remaining lifetime diagnosis apparatus according to Embodiment 3 of the present invention.

FIG. 8 is a set of explanatory charts for explaining a switching-device remaining lifetime diagnosis method and a switching-device remaining lifetime diagnosis apparatus according to Embodiment 3 of the present invention; (a) is an explanatory chart for explaining a system data in which frictional forces F are arranged with the abscissa of the elapsed time T during a period after the switching device has initially started to operate; (b) is an explanatory chart for explaining a system data in which frictional forces F, which are measured status amounts, are converted into status variables G by use of a transformation function fcorr, and the status variables G are arranged with the abscissa of the elapsed time.

With regard to values measured by a measurement unit such as a current sensor, status amounts such as frictional force and an operation time are stored as physical quantities. These physical quantities vary depending on the deterioration status of a switching device; however, the deterioration tendency thereof differs depending on the structure of the driving mechanism of the switching device. Therefore, in some cases, there exists a case where when the deterioration tendency is directly estimated by use of a measured physical quantity, the remaining lifetime cannot accurately be estimated.

Accordingly, in a switching-device remaining lifetime diagnosis method and a switching-device remaining lifetime diagnosis apparatus according to Embodiment 3 of the present invention, as a function, there is preliminarily prepared a physical-quantity variation tendency estimated from the structure of the driving mechanism, and from the function, there is created a transformation function G=fcorr (F) for transforming a physical quantity as a status amount related to the deterioration of the switching device 1 into a predetermined status amount for evaluating the deterioration tendency. A physical quantity, as a status amount, in status amount history data recorded in the recording unit 52 is transformed by use of the transformation function G into a predetermined status amount, and then the deterioration tendency is estimated by use of this transformed status amount.

For example, the values that indicate the cutoff performance of a switching device include the moving speed of the contact at a time when the switching device is disconnected, i.e., the disconnection speed. Because when the moving speed of the movable contact decreases, the cutoff performance is deteriorated, the disconnection speed can be defined to be a status amount indicating the performance of a switching device, i.e., a status amount related to the deterioration of the switching device. In contrast, it is assumed that frictional force is a status obtained by practically measuring the operation status of the switching device 1. In the disconnection operation of the switching device 1, the movable contact 112 is moved by the contact pressure spring 220 and by the electromagnetic force exerted by the electromagnetic actuator 12; therefore, the operation of the movable contact 112 can simply be expressed by the equation (1) below.

$$FT = m \cdot a \qquad (1)$$

where FT is force, exerted on the movable contact 112, that is the value of resultant force of the spring force of the contact pressure spring 220, the electromagnetic force exerted by the electromagnetic actuator 12, and the frictional force exerted on the sliding portion; a is acceleration; m is the weight of the movable part including the movable contact 112.

Letting F0 denote the component, among the components of the resultant force FT, that consists of the spring force and the electromagnetic force, which hardly change with time, and letting F denote the component of frictional force that changes with time, the following equation (2) is given.

$$F0 + F = m \cdot a \qquad (2)$$

There exist two or more methods of defining the disconnecting speed; however, in this explanation, the disconnecting speed v is defined to be x1/T1, based on the time T1 required for the movable contact 112 to move by a distance of x1. In this situation, x1 is given by the equation (3) below.

$$x1 = \tfrac{1}{2} a \cdot T1^2 \qquad (3)$$

Thus, the equation (4) below is established.

$$\begin{aligned} v &= x1/T1 \\ &= \sqrt{(1/2 \cdot a \cdot x1)} \\ &= \sqrt{(1/2 \cdot (F0+F)/m \cdot x1)} \end{aligned} \qquad (4)$$

The disconnection speed v changes approximately in proportion to the square root of the frictional force F.

Accordingly the transformation function G=fcorr (F) can be defined by the equation (5) below.

$$fcorr = \sqrt{(\tfrac{1}{2} \cdot (F0+F)/m \cdot x1)} \qquad (5)$$

Accordingly, the frictional force F in the system data with the abscissa of the elapsed time, represented in (a) of FIG. 8, is transformed into the status amount G, by use of the transformation function G represented in the equation (5); by arranging this status amount G with the abscissa of the elapsed time T, the first system data represented in (b) of FIG. 8 is created; based on the first system data, a regression line is obtained; then, the remaining lifetime of the switching device 1 can be estimated. In this example, the regression curve is a straight line; however, in general, a regression curve is represented by a polynomial expression. The status amount G obtained through such a transformation as described above has strong correlation compared to a regression curve such as a polynomial expression; therefore, the remaining lifetime can accurately be estimated.

In addition, even in the case of the same physical quantity, for example, frictional force, the transformation function for a system data with the abscissa of the elapsed time, the transformation function for a system data with the abscissa of the number of operations or an accumulated operation time, and the transformation function for a system data with the abscissa of the inoperative time are different from one another. This is because the respective deterioration factor models for the system data pieces are different from one another. Thus, for the system data pieces, respective transformation functions are prepared; by utilizing the first system data in which a predetermined status amount G that has been transformed by use of the corresponding transformation function is arranged with the abscissa of the elapsed time, the second system data in which the predetermined status amount G is arranged with the abscissa of the number of operations, and the third system data in which the predetermined status amount G is arranged with the abscissa of the inoperative time, the remaining lifetime of the switching device is estimated, so that accurate diagnosis can be implemented.

Specifically, as is the case with Embodiment 1 illustrated in FIG. 1, the status monitoring apparatus 5 receives current waveform data outputted from the current sensors 41 and 42 and, based on the current waveform data, estimates status amounts related to the deterioration status of the switching device 1, i.e., status amounts, such as a contact wear and tear amount, frictional force at a time of driving, and the capacitance of the driving capacitor 3, which specify the deterioration status of the switching device 1. As described above, the current sensors 41 and 42 measure the driving current two or more times at different time points; thus, based on each of the current waveform data measured two or more times, the status amount estimation unit 51 estimates the foregoing status amount that specifies the deterioration status, of the switching device 1, corresponding to each of the measurement time points. The estimated status amount is recorded, as history data, in the recording unit 52.

Next, when the remaining lifetime is estimated, the recorded history data is read, and the status amounts, as physical quantities thereof, are transformed by use of the transformation function G into the predetermined status amounts G. Then, in the step S1 of FIG. 6A, there are created a first system data in which the status amounts G are arranged with the abscissa of the elapsed time, a second system data in which the status amounts G are arranged with the abscissa of the number of operations, and a third system data in which the status amounts G are arranged with the abscissa of the inoperative time. Hereinafter, according to the steps S2 through S13 in the flowchart represented in FIGS. 6A and 6B, the development situation of deterioration in the switching device 1 is diagnosed in the same manner as in Embodiment 1, so that the deterioration factor that has caused the deterioration and the remaining lifetime of the switching device 1 are estimated. The value of the remaining lifetime estimated by the remaining lifetime estimation unit 53 and the estimated deterioration factor in the switching device 1 are transmitted to the display device 6, where they are displayed and notified to a maintenance staff.

The switching-device remaining lifetime diagnosis apparatus, according to Embodiment 3, configured in such a manner as described above makes it possible to more accurately estimate the remaining lifetime of a switching device.

Embodiment 4

Figure 9:
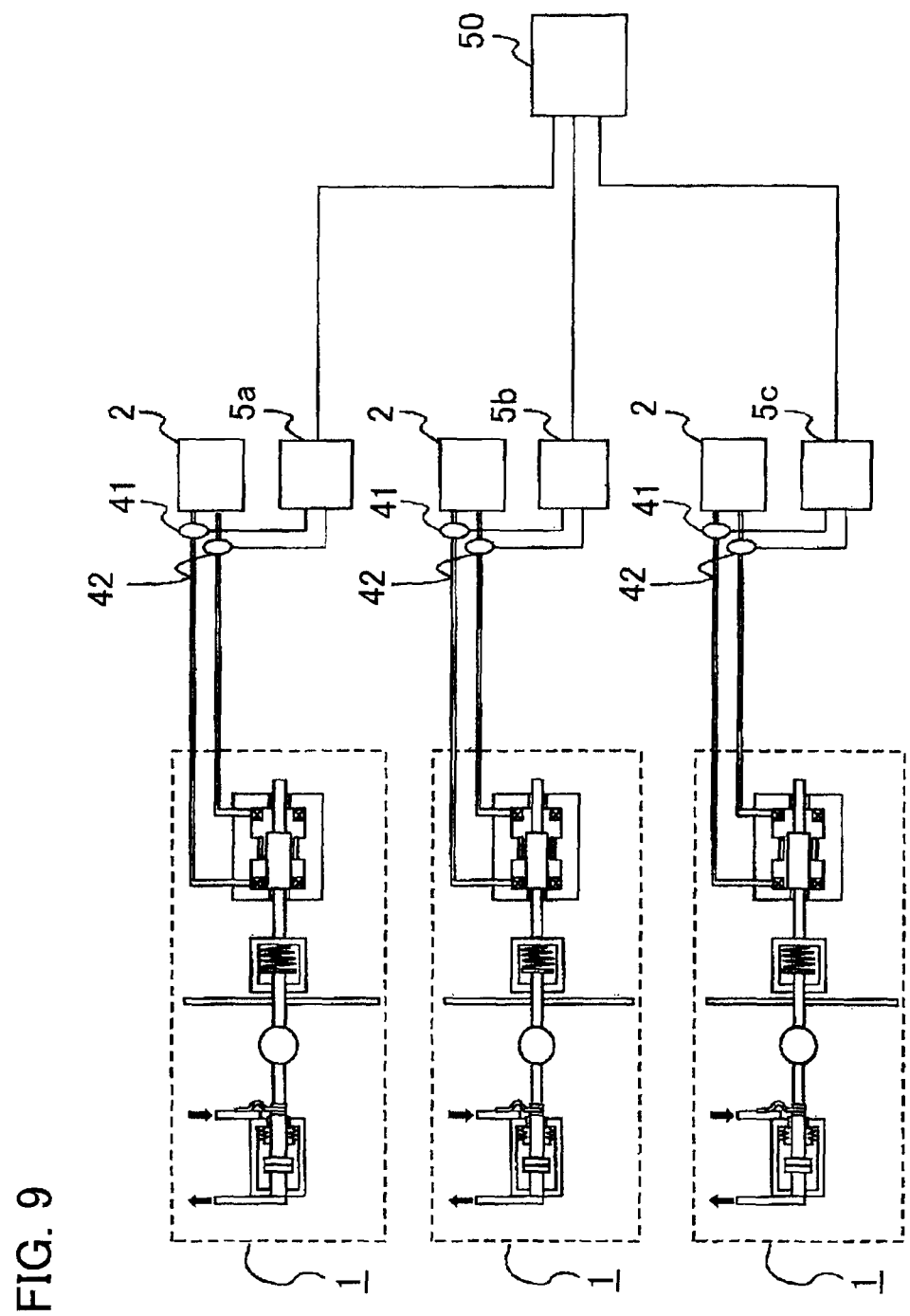
FIG. 9 is a configuration diagram illustrating a switching-device remaining lifetime diagnosis apparatus according to Embodiment 4 of the present invention.

FIG. 9 is a configuration diagram illustrating a switching-device remaining lifetime diagnosis apparatus according to Embodiment 4 of the present invention. In FIG. 9, three switching devices 1 are arranged in an electricity reception/distribution system, which is a single and the same plant. Each of the switching devices 1 is configured in the same manner as the switching device 1 in Embodiment 1. In each of the switching devices 1, there are provided a driving power source 2 and current sensors 41 and 42, as measurement units for measuring the performance characteristics of the respective switching devices 1, in such a manner as those in Embodiment 1.

The current sensors 41 and 42 output, as analogue signals or digital signals, current waveform data pieces on the measured driving currents and inputs the data pieces to status monitoring apparatuses 5a, 5b, and 5c provided in the respective switching devices 1. Based on the current waveform data pieces from the current sensors 41 and 42, each of the status monitoring apparatuses 5a, 5b, and 5c records, in a recording unit, status amounts related to deterioration in the corresponding switching device 1, in the same manner as in Embodiment 1, and estimates the remaining lifetime and the deterioration factor.

Furthermore, the status monitoring apparatuses 5a, 5b, and 5c are connected with an overall monitoring apparatus 50; the status amounts and the record of the result of remaining-lifetime estimation held in the status monitoring apparatus 5a, 5b, and 5c are copied by the overall monitoring apparatus 50.

In the overall monitoring apparatus 50, there is integrated the whole data from the records of the status amounts obtained by copying those in the status monitoring apparatuses 5a, 5b, and 5c; then, there are configured system data in which the status amounts are arranged with the abscissa of the elapsed time or system data in which the status amounts are arranged with the abscissa of the number of operations and system data in which the status amounts are arranged with the abscissa of the inoperative time or system data in which the status amounts are arranged with the abscissa of the number of operations, or there is configured system data in which the status amounts are arranged with the abscissa of the accumulated operation time, and based on at least one of the foregoing system data pieces, the remaining lifetime of the overall switching device is estimated.

The remaining lifetime of the switching device and the deterioration factor are estimated in the same manner as in each of Embodiments 1 through 3.

In the case of the foregoing switching-device remaining lifetime diagnosis apparatus according to Embodiment 4, there can be estimated the remaining lifetime of the switching device, among the two or more switching devices provided in a single and the same electricity reception/distribution system, the number of operations and the number of the history data pieces of which are small, as well as the other switching devices.

Embodiment 5

Figure 10:
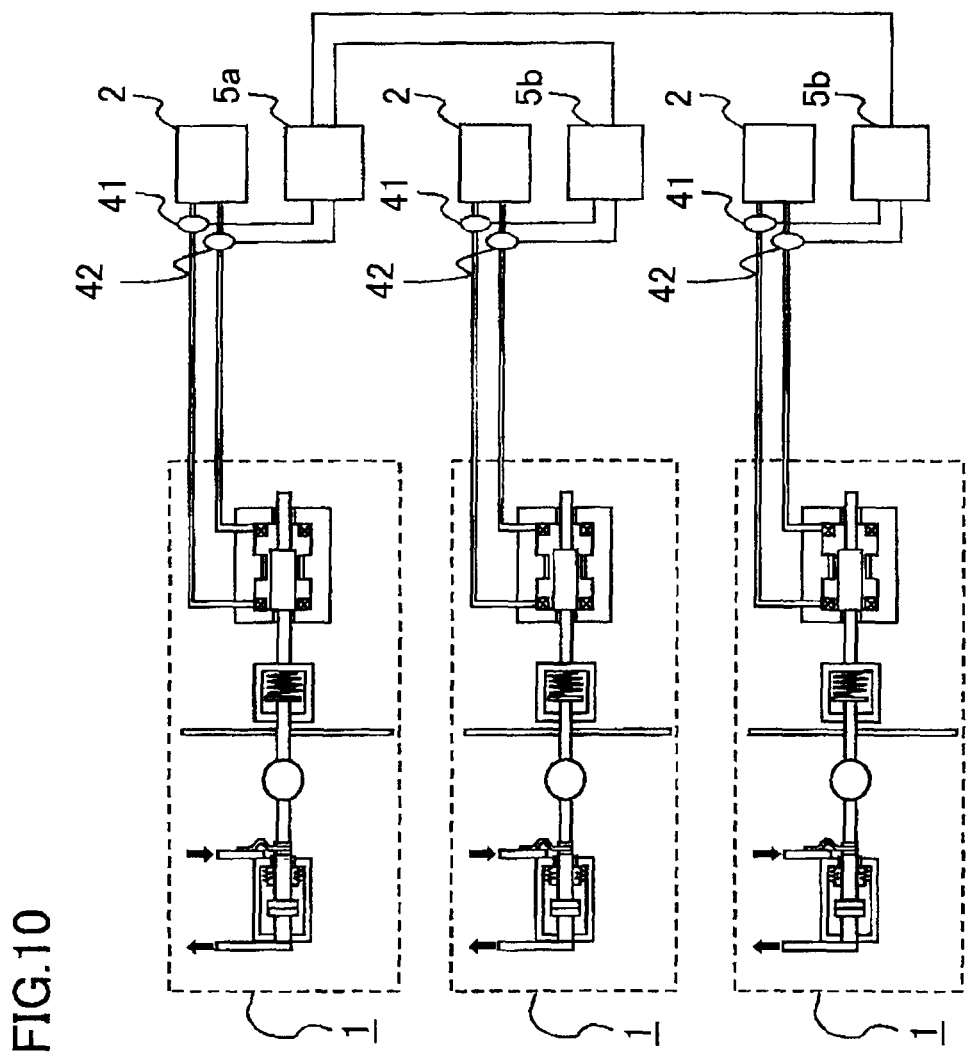
FIG. 10 is a configuration diagram illustrating a switching-device remaining lifetime diagnosis apparatus according to Embodiment 5 of the present invention.

FIG. 10 is a configuration diagram illustrating a switching-device remaining lifetime diagnosis apparatus according to Embodiment 5 of the present invention. In Embodiment 5, as illustrated in FIG. 10, the overall monitoring apparatus 50 of Embodiment 4 is not provided; instead, the status monitoring apparatus 5a has the function of an overall monitoring apparatus.

The remaining lifetime of the switching device and the deterioration factor are estimated in the same manner as in each of Embodiments 1 through 3.

The switching-device remaining lifetime diagnosis apparatus according to Embodiment 5 makes it possible to remove the overall monitoring apparatus 50, whereby a low-cost remaining lifetime diagnosis apparatus can be configured.

Embodiment 6

Figure 11:
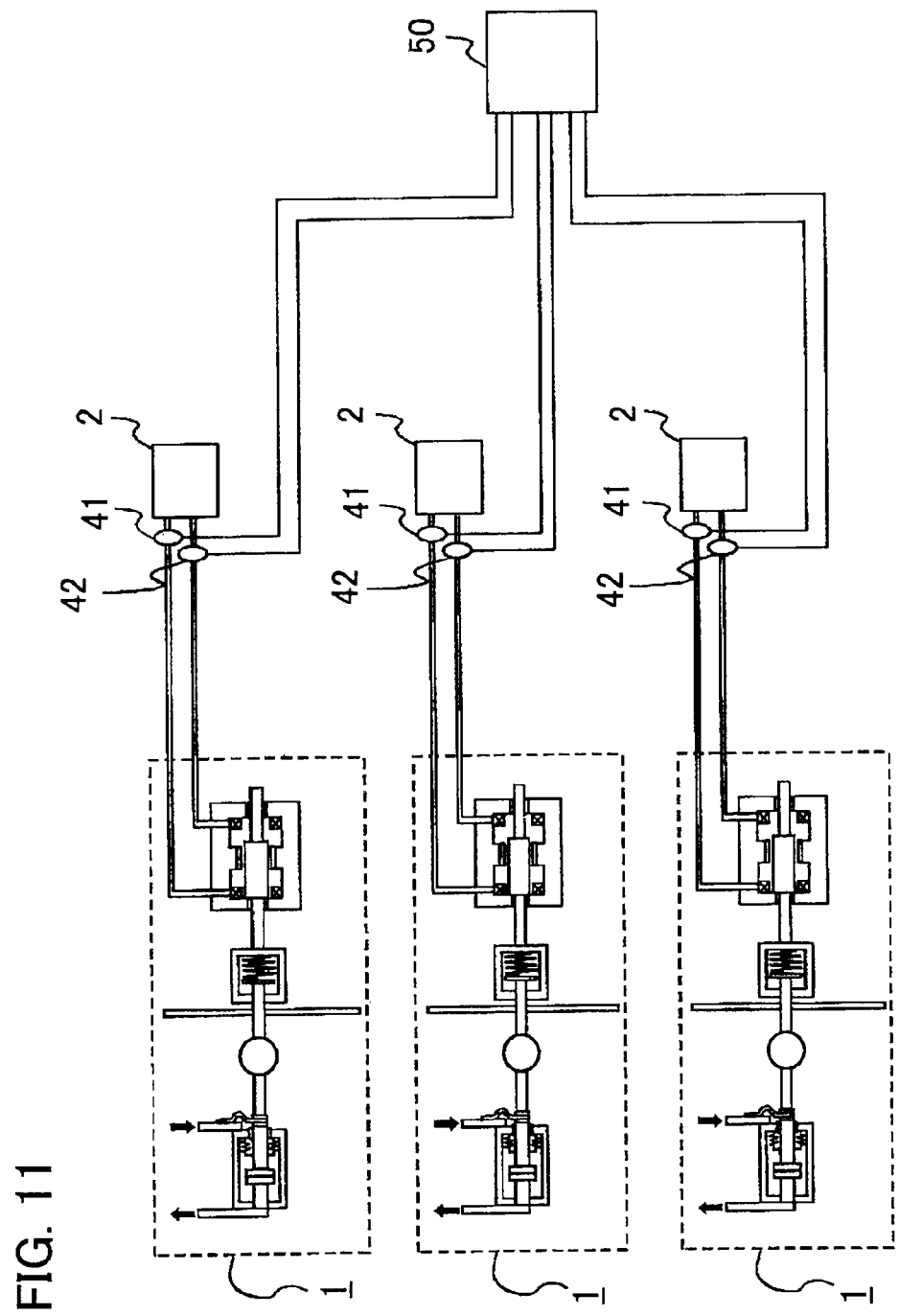
FIG. 11 is a configuration diagram illustrating a switching-device remaining lifetime diagnosis apparatus according to Embodiment 6 of the present invention.

FIG. 11 is a configuration diagram illustrating a switching-device remaining lifetime diagnosis apparatus according to Embodiment 6 of the present invention. In Embodiment 6, the status monitoring apparatuses 5a, 5b, and 5c, illustrated in FIG. 9, according to Embodiment 4 are not provided; instead, the overall monitoring apparatus 50 has the functions of the status monitoring apparatuses 5a, 5b, and 5c.

The remaining lifetime of the switching device and the deterioration factor are estimated in the same manner as in each of Embodiments 1 through 3.

The switching-device remaining lifetime diagnosis apparatus according to Embodiment 6 makes it possible to remove the status monitoring apparatuses 5a, 5b, and 5c for the respective switching devices 1, whereby a low-cost remaining lifetime diagnosis apparatus can be configured.

Embodiment 7

In the case where as Embodiments 4 through 6 illustrated in FIGS. 9, 10, and 11, respectively, two or more circuit breakers are arranged in a single and the same electricity reception/distribution system, in some cases, there exist a switching device that has operated frequently and for which sufficient status amount history data has been recorded and a switching device that has not operated frequently and for which sufficient status amount history data has not been recorded or a switching device that has not operated for a long time and for which there exists no recent status amount history data. In such a case, it is difficult to estimate the remaining lifetime of a switching device having little status amount history data or a switching device having no recent status amount history data. However, it is possible to consider that in all the two or more switching devices in a single and the same electricity reception/distribution system, deterioration has developed in approximately the same manner.

Accordingly, in a switching-device remaining lifetime diagnosis apparatus according to Embodiment 7 of the present invention, based on at least one of system data pieces for the switching device, among two or more switching devices arranged in a single and the same electricity reception/distribution system, that has the largest number of operations, the remaining lifetimes of the other switching devices are estimated. The remaining lifetime of the switching device and the deterioration factor are estimated in the same manner as in each of Embodiments 1 through 3.

Thus, in the case of the switching-device remaining lifetime diagnosis apparatus according to Embodiment 7 of the present invention, even when there exists a switching device that is provided in a single and the same electricity reception/distribution system and that has little status amount history data or no status amount history data, the remaining lifetimes of all switching devices can be estimated.

Embodiment 8

In a switching-device remaining lifetime diagnosis method and a switching-device remaining lifetime diagnosis apparatus according to Embodiment 8 of the present invention, there is extracted only data based on the measurements of the recent N-time operations from status amount history data, and there are created a first system data in which the status amounts thereof are arranged with the abscissa of the elapsed time, a second system data in which the status amounts thereof are arranged with the abscissa of the number of operations, a third system data in which the status amounts thereof are arranged with the abscissa of the inoperative time, and a fourth system data in which the status amounts thereof are arranged with the abscissa of the accumulated operation time; based on these system data pieces, the remaining lifetime of the switching device 1 is estimated in the same manner as in the steps S2 through S9 and the step S13 in the flowcharts of FIGS. 6A and 6B described in Embodiment 1.

In Embodiment 8, in the step S9, no corresponding deterioration tendency is removed from each of the system data pieces; then, the step S9 is followed by the step S13, where the smallest estimation value among two or more estimated remaining lifetime values is estimated as the remaining lifetime of the switching device.

In Embodiment 8, it may be allowed that based on status amount history data obtained through the recent N-time operations of a switching device, as is the case with Embodiment 2, there are calculated, every predetermined number of measurements, respective variance values of the status amounts, there are created a first system data in which the variance values are arranged with the abscissa of the elapsed time, a second system data in which the variance values are arranged with the abscissa of the number of operations of the switching device, a third system data in which the variance values are arranged with the abscissa of the inoperative time of the switching device, and a fourth system data in which the variance values are arranged with the abscissa of the accumulated operation time of the switching device, and then, based on at least one of the foregoing system data pieces, the remaining lifetime of the switching device is estimated.

Moreover, in Embodiment 8, it may be allowed that based on status amount history data obtained through the recent N-time operations of a switching device, as is the case with Embodiment 3, the status amounts are transformed by use of a predetermined transformation function, into predetermined status amounts, there are created a first system data in which the predetermined status amounts are arranged with the abscissa of the elapsed time, a second system data in which the predetermined status amounts are arranged with the abscissa of the number of operations or the accumulated operation time, and a third system data in which the predetermined status amounts are arranged with the abscissa of the inoperative time or a fourth system data in which the predetermined status amounts are arranged with the abscissa of the accumulated operation time of the switching device, and then, based on at least one of the foregoing system data pieces, the remaining lifetime of the switching device is estimated.

Still moreover, as is the case with Embodiments 4 through 7, Embodiment 8 can also be applied to a case where two or more switching devices are provided in a single and the same electricity reception/distribution system.

In the case of a switching-device remaining lifetime diagnosis apparatus according to Embodiment 8 of the present invention, even in the case where it is difficult to grasp a deterioration tendency through a tendency analysis to be started at a time point of the initial operation of a switching device, an analysis of the data on the recent N-time operations makes it possible to estimate the remaining lifetime of the switching device.

Embodiment 9

As describe in Embodiment 1, the wear and tear of the sliding portion in the switching device 1 develops as the operation of the switching device continues. Accordingly, in the case where the contributing factor of the deterioration in the sliding portion is wear and tear of the sliding portion, the development of the deterioration in the sliding portion largely depends on the accumulated operation time obtained by accumulating the operation times of the switching device 1 as well as the number of operations of the switching device 1 described in Embodiment 1. The deterioration in the sliding portion continuously develops from its initial state at a time when the switching device 1 starts to operate.

Furthermore, the roughness on the sliding portion of the switching device 1 is produced by a scratch on the surface of the sliding portion caused by a certain factor; the scratch on the surface of the sliding portion is enlarged each time the switching device 1 repeats its opening/closing operation. Therefore, in the case where the contributing factor of deterioration in a sliding portion is roughness in the sliding portion, frictional force exerted when the switching device 1 performs its opening/closing operation increases, as is the case with the foregoing wear and tear of the sliding portion, whereby the deterioration in the sliding portion develops in proportion to not only the number of opening/closing operations of the switching device 1 but also the accumulated operation time obtained by accumulating the opening/closing operation times of the switching device 1.

Figure 12:
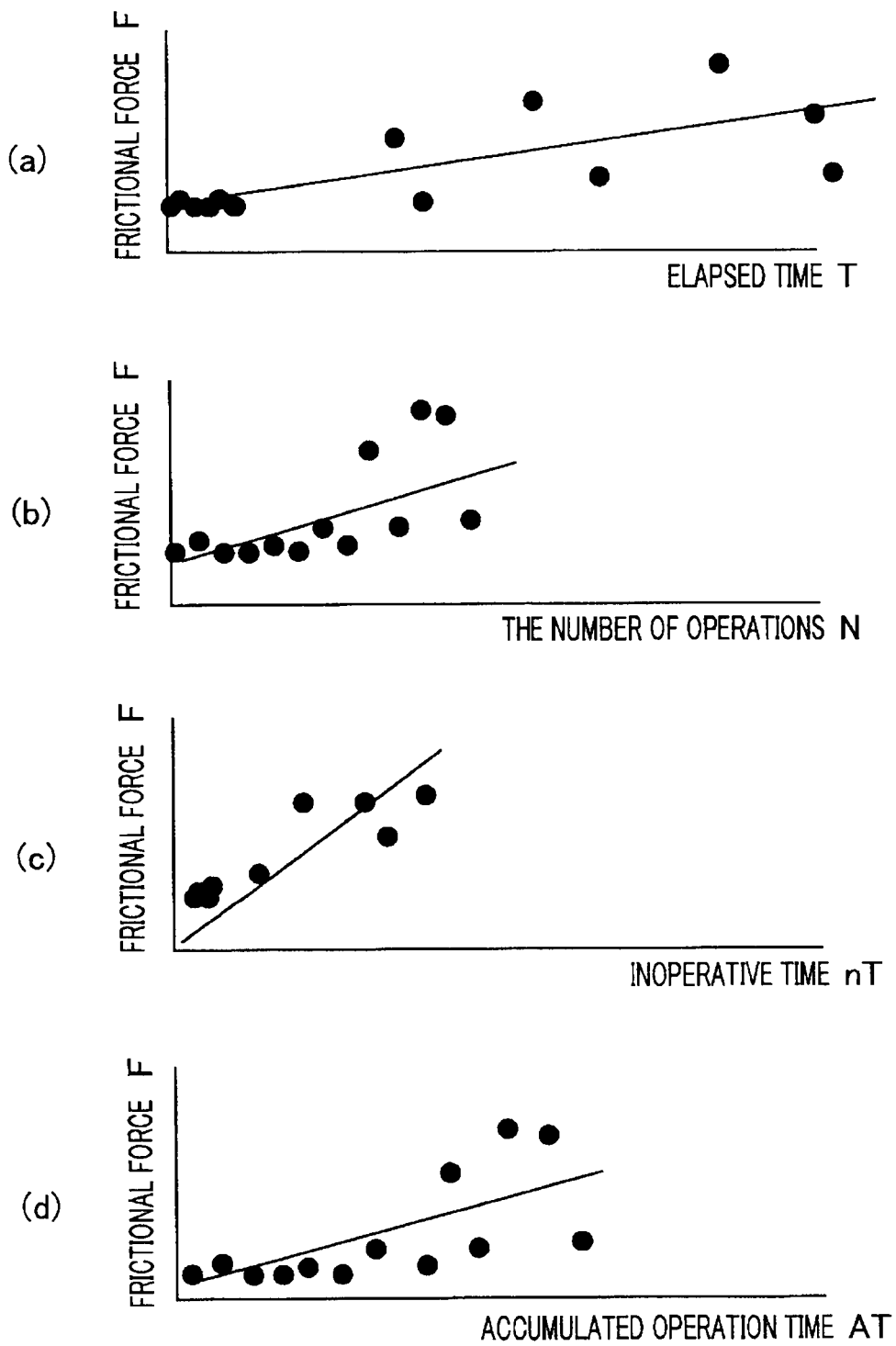
FIG. 12 is a set of graphs representing a case where frictional force is rendered as data in four different systems.

FIG. 12 is a set of graphs representing a case where the status amount related to deterioration in the switching device 1, i.e., frictional force F, which is one of the deterioration factors, caused by corrosion in the sliding portion is rendered as data in four different systems, based on status amount history data; (a), (b), and (c) are the same as those described in Embodiment 1; (a) is a graph of first system data in which frictional forces F, which are status amounts related to deterioration in a switching device, are sequentially arranged with the abscissa of the elapsed time T during the operation period of the switching device 1; (b) is a graph of second system data in which the frictional forces F are sequentially arranged with the abscissa of the number of operations N during the operation period of the switching device; (c) is a graph of third system data in which the frictional forces F are sequentially arranged with the abscissa of the inoperative time nT during the operation period of the switching device. The chart (d) is a graph of seventh system data in which the frictional forces F are sequentially arranged with the abscissa of the accumulated operation time AT during the operation period of the switching device.

In a switching-device remaining lifetime diagnosis method and a switching-device remaining lifetime diagnosis apparatus according to Embodiment 9 of the present invention, there are created a first system data in which status amounts related to deterioration in a switching device are arranged with the abscissa of the total elapsed time during a period after a time point when the switching device 1 has initially been operated, a second system data in which the foregoing status amounts are arranged with the abscissa of the number of total operations of the switching device during the period after the time point when the switching device 1 has initially been operated, a third system data in which the foregoing status amounts are arranged with the abscissa of the total inoperative time of the switching device during the period after the time point when the switching device 1 has initially been operated, a fourth system data in which the foregoing status amounts are arranged with the abscissa of the total accumulated operation time of the switching device during the period after the time point when the switching device 1 has initially been operated, a fifth system data in which the foregoing status amounts are arranged with the abscissa of the recent elapsed time during the operation period of the switching device, a sixth system data in which the foregoing status amounts are arranged with the abscissa of the number of operations of the switching device during the period after the time point when the predetermined period has elapsed, a seventh system data in which the foregoing status amounts are arranged with the abscissa of the inoperative time of the switching device during the period after the time point when the predetermined period has elapsed, and an eighth system data in which the foregoing predetermined status amounts are arranged with the abscissa of the accumulated operation time of the switching device during the period after the time point when the predetermined period has elapsed; then, based on the created system data pieces, the remaining lifetime of the switching device is estimated.

In the switching-device remaining lifetime diagnosis method and the switching-device remaining lifetime diagnosis apparatus according to Embodiment 9 of the present invention, the remaining lifetime estimation unit 53 creates the foregoing system data pieces and estimates the remaining lifetime.

Next, the operation of a switching-device remaining lifetime diagnosis method and a switching-device remaining lifetime diagnosis apparatus according to Embodiment 9 of the present invention will be explained. The explanation for the same parts as those in Embodiment 1 will be omitted. The remaining lifetime estimation unit 53 reads status amount history data recorded in the recording unit 52; firstly, based on the status amount history data, the remaining lifetime estimation unit 53 creates a first system data in which the status amounts are sequentially arranged with the abscissa of the elapsed time T from a time point when the switching device 1 has initially been operated, a second system data in which the status amounts are arranged with the abscissa of the number of operations N from a time point when the switching device 1 has initially been operated, a third system data in which the status amounts are arranged with the abscissa of the inoperative time nT from a time point when the switching device 1 has initially been operated, and a seventh system data in which the status amounts are arranged with the abscissa of the accumulated operation time AT obtained by accumulating the opening/closing operations from a time point when the switching device 1 has initially been operated; then, the remaining lifetime estimation unit 53 estimates the remaining lifetime of the switching device 1, based on at least one of the system data pieces. The following explanation will be made by utilizing, as the status amount, the frictional force F exerted on the sliding portion; however, it goes without saying that another status amount can be utilized.

Figure 13A:
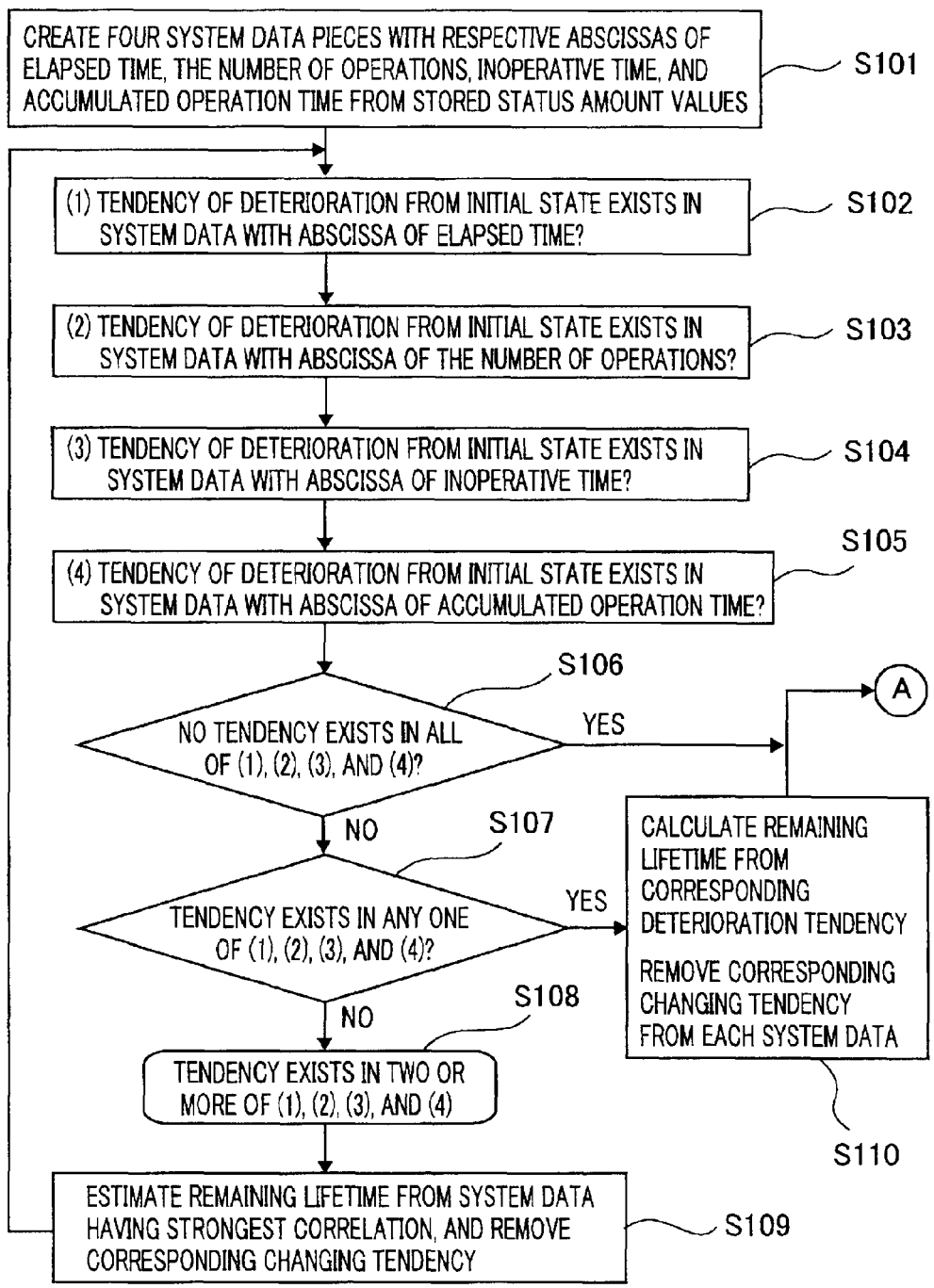
FIGS. 13A and 13B are a set of flowcharts for explaining the operation of a switching-device remaining lifetime diagnosis apparatus according to Embodiment 9 of the present invention.
Figure 13B:
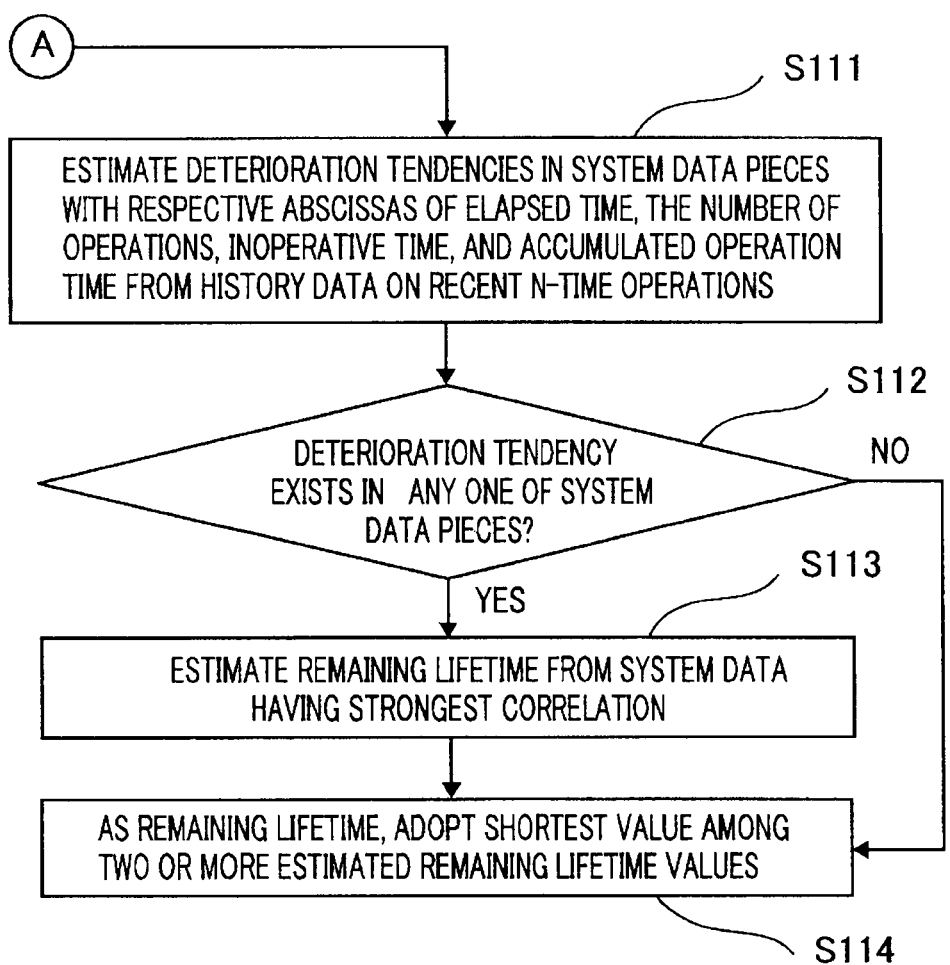

FIGS. 13A and 13B are a set of flowcharts for explaining the operation in which the remaining lifetime estimation unit 53 of the status monitoring apparatus 5 estimates the remaining lifetime of the switching device 1 by determining, from the foregoing first system data to eighth system data, the deterioration tendency of the frictional force exerted on the switching device 1.

In FIG. 13A, at first, in the step S101, all the status amount history data recorded in the recording unit 52 of the status monitoring apparatus 5 is read; then, there is rendered the first system data in which the frictional forces F, which are status amounts in the read status amount history data, are arranged with the abscissa of the total elapsed time T during a period after a time point when the switching device 1 has initially started to operate. The elapsed time first system data corresponds to the first system data represented in (a) of FIG. 12, described above.

Moreover, in the step S101, there is rendered the second system data in which the frictional forces F, which are status amounts in the read status amount history data, are arranged with the abscissa of the number of all operations N of the switching device 1 during a period after a time point when the switching device 1 has initially started to operate. The second system data corresponds to the second system data represented in (b) of FIG. 12, described above.

Furthermore, in the step S101, there is created the third system data in which the frictional forces F, which are status amounts in the read status amount history data, are arranged with the abscissa of the total inoperative time nT of the switching device 101 during a period after a time point when the switching device 1 has initially started to operate. The third system data corresponds to the third system data represented in (c) of FIG. 12, described above.

Still moreover, in the step S101, there is created the seventh system data in which the frictional forces F, which are status amounts in the read status amount history data, are arranged with the abscissa of the total accumulated operation time of the switching device 101 during a period after a time point when the switching device 1 has initially started to operate. The seventh system data corresponds to the seventh system data represented in (d) of FIG. 12, described above.

Next, in the steps S102, S103, and S104, the same determinations as in the steps S2, S3, and S4, respectively, of Embodiment 1 are performed. In the step S105, it is determined whether or not in the seventh system data, there is recognized a tendency in which the frictional force F at a time when the switching device 1 initially starts to operate is deteriorated as the accumulated operation time AT increases. In the determination implemented in the step S105, in the case where as represented in (d) of FIG. 12, a regression line RL4 is obtained, when the correlation coefficient of the regression line RL4 is the same as or larger than a predetermined value and the gradient of the regression line RL4 is the same as or smaller than a predetermined value (or the same as or larger than a predetermined value), it is determined that the deterioration tendency of the frictional force F is recognized; in other cases, it is determined that the deterioration tendency of the frictional force F is not recognized.

Next, in the step S106, it is determined whether or not in all the results of the determinations implemented in the steps S102, S103, S104, and S105, there is recognized, in the frictional force F, no tendency of deterioration in the switching device 1 from the initial state thereof; in the case where in all the results of the determinations implemented in the steps S102, S103, S104 and S105, there is recognized, in the frictional force F, no deterioration tendency (YES), the step S106 is followed by the step S111; in the case where in at least one of the results of the determinations implemented in the steps S102, S103, S104, and S105, there is recognized a deterioration tendency in the frictional force F (NO), the step S106 is followed by the step S107.

In the step S107, it is determined whether or not in only one of the results of the determinations implemented in the steps S102, S103, S104, and S105, there is recognized a deterioration tendency in the frictional force F; in the case where it is determined that in only one of the system data pieces, there exists a deterioration tendency in the frictional force F (YES), the step S107 is followed by the step S110; in the case where it is determined that in two or more system data pieces, there exist deterioration tendencies (NO), the step S107 is followed by the step S108.

In the case where in the steps described above, it is determined that in two or more system data pieces among the results of the determinations implemented in the steps S102, S103, and S104, there are recognized deterioration tendencies of the frictional force F, the flow of the flowchart passes through the step S108; then, the step S108 is followed by the step S109. In the step S109, the estimation value of the remaining lifetime of the switching device 1 is calculated from the system data, among two or more system data pieces in which the deterioration tendency of the frictional force F is recognized, which has the largest correlation coefficient of a regression line.

In the following steps S110, S111, S112, S113, and S114, the same processing items as in the steps S9, S10, S11, S12, and S13 explained in Embodiment 1 are implemented; therefore, the explanation therefore will be omitted.

Embodiment 10

In a switching-device remaining lifetime diagnosis method and a switching-device remaining lifetime diagnosis apparatus according to Embodiment 10 of the present invention, based on accumulated status amount history data, there is calculated the variance value of the status amounts every predetermined number of measurements, and then there are created the first system data in which the variance values are arranged with the abscissa of the total elapsed time during a period after a time point when the switching device 1 has initially been operated, the second system data in which the variance values are arranged with the abscissa of the number of total operations of the switching device during the period after the time point when the switching device 1 has initially been operated, the third system data in which the variance values are arranged with the abscissa of the total inoperative time of the switching device during the period after the time point when the switching device 1 has initially been operated, a fourth system data in which the variance values are arranged with the abscissa of the total accumulated operation time of the switching device during the period after the time point when the switching device 1 has initially been operated, a fifth system data in which the variance values are arranged with the abscissa of the recent elapsed time during the operation period of the switching device, a sixth system data in which the variance values are arranged with the abscissa of the number of operations of the switching device during the period after the time point when the predetermined period has elapsed, a seventh system data in which the variance values are arranged with the abscissa of the inoperative time of the switching device during the period after the time point when the predetermined period has elapsed, and an eighth system data in which the variance values are arranged with the abscissa of the accumulated operation time of the switching device during the period after the time point when the predetermined period has elapsed; based on the created system data pieces, the remaining lifetime of the switching device is estimated.

The development situation of deterioration in the switching device 1 is diagnosed in the same manner as in Embodiment 9, so that the deterioration factor that has caused the deterioration and the remaining lifetime of the switching device 1 are estimated. The value of the remaining lifetime estimated by the remaining lifetime estimation unit 53 and the estimated deterioration factor in the switching device 1 are transmitted to the display device 6, where they are displayed and notified to a maintenance staff.

Embodiment 11

In a switching-device remaining lifetime diagnosis method and a switching-device remaining lifetime diagnosis apparatus according to Embodiment 11 of the present invention, the status amounts in accumulated status amount history data are transformed by use of a predetermined transformation function into predetermined status amounts; there are created a first system data in which the predetermined status amounts are arranged with the abscissa of the total elapsed time during a period after a time point when the switching device 1 has initially been operated, a second system data in which the predetermined status amounts are arranged with the abscissa of the number of total operations of the switching device during the period after the time point when the switching device has initially been operated, a third system data in which the predetermined status amounts are arranged with the abscissa of the total inoperative time of the switching device during the period after the time point when the switching device has initially been operated, a fourth system data in which the predetermined status amounts are arranged with the abscissa of the total accumulated operation time of the switching device during the period after the time point when the switching device has initially been operated, a fifth system data in which the predetermined status amounts are arranged with the abscissa of the recent elapsed time during the operation period of the switching device, a sixth system data in which the predetermined status amounts are arranged with the abscissa of the number of operations of the switching device during the period after the time point when the predetermined period has elapsed, a seventh system data in which the predetermined status amounts are arranged with the abscissa of the inoperative time of the switching device during the period after the time point when the predetermined period has elapsed, and an eighth system data in which the foregoing predetermined status amounts are arranged with the abscissa of the accumulated operation time of the switching device during the period after the time point when the predetermined period has elapsed; then, based on the created system data pieces, the remaining lifetime of the switching device is estimated.

The development situation of deterioration in the switching device 1 is diagnosed in the same manner as in Embodiment 9, so that the deterioration factor that has caused the deterioration and the remaining lifetime of the switching device 1 are estimated. The value of the remaining lifetime estimated by the remaining lifetime estimation unit 53 and the estimated deterioration factor in the switching device 1 are transmitted to the display device 6, where they are displayed and notified to a maintenance staff.

INDUSTRIAL APPLICABILITY

A switching-device remaining lifetime diagnosis apparatus according to the present invention can be applied to an electric power switching device or the like that drives the movable contact of a circuit breaker such as a vacuum valve by use of a driving mechanism such as an electromagnetic actuator so as to open or close an electric power circuit.

The invention claimed is:

1. A switching-device remaining lifetime diagnosis method, comprising:
    measuring performance characteristics of an electric power switching device is by a measurement unit to obtain measurement data;
    estimating a deterioration status of the switching device based on the obtained measurement data;
    accumulating the estimated deterioration status of the switching device over time as status amount history data of the switching device by a status amount estimation unit;
    creating, by a remaining lifetime estimation unit, two or more system data pieces, by a remaining lifetime estimation unit, based on the accumulated status amount history data, each of the two or more system data pieces including one of
        a first system data piece in which the status amount history data are arranged with the abscissa of at least part of an elapsed time during an operation period of the switching device,
        a second system data piece in which the status amount history data are arranged with the abscissa of the number of operations of the switching device during the at least part of an elapsed time,
        a third system data piece in which the status amount history data are arranged with the abscissa of an inoperative time of the switching device during the at least part of an elapsed time, and
        a fourth system data piece in which the status amount history data are arranged with the abscissa of an accumulated operation time of the switching device during the at least part of an elapsed time;
    determining which one of the created two or more system data pieces has a strongest correlation between the abscissa of the created system data piece and the corresponding status amounts as an extracted first deterioration tendency of the switching device;
    calculating a first estimation value of the remaining lifetime of the switching device based on the extracted first deterioration tendency;
    removing the extracted first deterioration tendency from the created two or more system data pieces;
    determining which one of the two or more system data pieces from which the first deterioration tendency has been removed has a strongest correlation between the abscissa of the created system data piece and the corresponding status amounts as an extracted second deterioration tendency is of the switching device;
    calculating a second estimation value of the remaining lifetime of the switching device based on the extracted second deterioration tendency; and
    determining the remaining lifetime of the switching device based on at least the first estimation value and the second estimation value of the remaining lifetime.

2. The switching-device remaining lifetime diagnosis method according to claim 1, further comprising:
    moving a movable contact in the electric power switching device by a driving mechanism in such a way that the movable contact makes contact with or is separated from the fixed contact, in order to open or close an electric circuit; and
    the deterioration status estimated by the estimating the deterioration status step includes a wear and tear amount of the fixed contact and the movable contact, a frictional force at the time of driving the movable contact by the driving mechanism, and a capacitance of a driving capacitor that supplies a driving current to the driving mechanism.

3. The switching-device remaining lifetime diagnosis method according to claim 1, wherein calculating an estimation value of the remaining lifetime is repeated until there exists no deterioration tendency of the switching device in the system data having the strongest correlation, and the number of remaining-lifetime estimation values is the same as the number of the created system data pieces.

4. The switching-device remaining lifetime diagnosis method according to claim 1, wherein calculating an estimation value of the remaining lifetime is implemented by use of a correlation function based on the created system data.

5. The switching-device remaining lifetime diagnosis method according to claim 1, wherein calculating an estimation value of the remaining lifetime is implemented by use of the difference between the created system data and a regression line or a regression curve based on the created system data.

6. A switching-device remaining lifetime diagnosis method, comprising:
    measuring performance characteristics of an electric power switching device is by a measurement unit to obtain measurement data;
    estimating a deterioration status of the switching device based on the obtained measurement data;
    accumulating the estimated deterioration status of the switching device over time as status amount history data of the switching device by a status amount estimation unit;
    transforming the status amounts in the accumulated status amount history data into predetermined status amounts by use of a predetermined transformation function;
    creating, by a remaining lifetime estimation unit, two or more system data pieces based on the predetermined status amounts, each of the two or more system data pieces including one of
        a first system data piece in which the predetermined status amounts are arranged with the abscissa of at least part of an elapsed time during an operation period of the switching device,
        a second system data piece in which the predetermined status amounts are arranged with the abscissa of the number of operations of the switching device during the at least part of an elapsed time,
        a third system data piece in which the predetermined status amounts are arranged with the abscissa of an inoperative time of the switching device during the at least part of an elapsed time, and
        a fourth system data piece in which the predetermined status amounts are arranged with the abscissa of an accumulated operation time of the switching device during the at least part of an elapsed time;
    determining which one of the created two or more system data pieces has a strongest, correlation between the abscissa of the created system data piece and the corresponding predetermined status amounts as an extracted first deterioration tendency of the switching device;
    calculating a first estimation value of the remaining lifetime of the switching device based on the extracted first deterioration tendency;

removing the extracted first deterioration tendency from the created two or more system data pieces;

determining which one of the two or more system data pieces from which the first deterioration tendency has been removed has a strongest correlation between the abscissa of the created system data piece and the corresponding predetermined status amounts as an extracted second deterioration tendency of the switching device;

calculating a second estimation value of the remaining lifetime of the switching device based on the extracted second deterioration tendency; and determining the remaining lifetime of the switching device based on at least the first estimation value and the second estimation value of the remaining lifetime.

7. The switching-device remaining lifetime diagnosis method according to claim 6, wherein the predetermined transformation function differs depending on each of the system data pieces.

8. A switching-device remaining lifetime diagnosis method, comprising:

measuring performance characteristics of an electric power switching device by a measurement unit to obtain measurement data estimating a deterioration status of the switching device based on the obtained measurement data;

accumulating the estimated deterioration status of the switching device over time as status amount history data of the switching device by a status amount estimation unit;

creating, by a remaining lifetime estimation unit, two or more total-elapsed-time system data pieces based on the accumulated status amount history data, each of the two or more system data pieces including one of a first total-elapsed-time system data piece in which the status amount history data are arranged with the abscissa of a total elapsed time during an operation period of the switching device, a second total-elapsed-time system data piece in which the status amount history data are arranged with the abscissa of the number of operations of the switching device during the total elapsed time, a third total-elapsed-time system data piece in which the status amount history data are arranged with the abscissa of an inoperative time of the switching device during the total elapsed time, a fourth total-elapsed-time system data piece in which the status amount history data are arranged with the abscissa of an accumulated operation time of the switching device during the total elapsed time, and, creating, at the same time, by the remaining lifetime estimation unit, two or more post-predetermined-period system data pieces, each of the two or more post-predetermined-period system data pieces including one of a first post-predetermined-period system data piece in which the status amount history data are arranged with the abscissa of an elapsed time during a period after the time point when a predetermined period has elapsed from a time point when the switching device had initially started to operate, a second post-predetermined-period system data piece in which the status amount history data are arranged with the abscissa of the number of operations of the switching device during a period after the time point when the predetermined period has elapsed, a third post-predetermined-period system data piece in which the status amount history data are arranged with the abscissa of an inoperative time of the switching device during a period after the time point when the predetermined period has elapsed, and a fourth post-predetermined-period system data piece in which the status amount history data are arranged with the abscissa of an accumulated operation time of the switching device during a period after the time point when the predetermined period has elapsed;

determining which one of the created two or more total-elapsed-time system data pieces or the created two or more post-predetermined-period system data pieces has a strongest correlation between the abscissa of the created system data piece and the corresponding status amounts as an extracted first deterioration tendency of the switching device;

calculating a first estimation value of the remaining lifetime of the switching device based on the extracted first deterioration tendency;

removing the extracted first deterioration tendency from the created two or more system data pieces;

determining which one of the two or more system data pieces from which the first deterioration tendency has been removed has a strongest correlation between the abscissa of the created system data piece and the corresponding status amounts as an extracted second deterioration tendency of the switching device;

calculating a second estimation value of the remaining lifetime of the switching device based on the extracted second deterioration tendency; and determining the remaining lifetime of the switching device based on at least the first estimation value and the second estimation value of the remaining lifetime.

9. A switching-device remaining lifetime diagnosis apparatus for diagnosing the remaining lifetime of a switching device that includes a movable contact driven by a driving mechanism in such a way that the movable contact makes contact with or is separated from a fixed contact, in order to open or close an electric circuit, the switching-device remaining lifetime diagnosis apparatus comprising:

a measurement unit that measures performance characteristics of the switching device;

a status amount estimation unit that estimates a status amount related to a deterioration status of the switching device, based on measurement data obtained by the measurement unit;

a recording unit that records as status amount history data the status amount estimated by the status amount estimation unit; and a remaining lifetime estimation unit that estimates the remaining lifetime of the switching device, based on the status amount history data recorded in the recording unit, wherein based on the accumulated status amount history data, the remaining lifetime estimation unit creates two or more system data pieces, each of the two or more system data pieces including one of a first system data piece in which the status amount history data are arranged with the abscissa of at least part of an elapsed time during an operation period of the switching device, a second system data piece in which the status amount history data are arranged with the abscissa of the number of operations of the switching device during the elapsed time, a third system data piece in which the status amount history data are arranged with the abscissa of an inoperative time of the switching device during the elapsed time, and a fourth system data piece in which the status amount history data are arranged with the abscissa et of an accumulated operation time of the switching device during the elapsed time;

the remaining lifetime estimation unit also determines which one of the created two or more system data pieces has a strongest correlation between the abscissa of the created system data piece and the corresponding status amounts as an extracted first deterioration tendency of the switching device, calculates a first estimation value of the remaining lifetime of the switching device based on the extracted first deterioration tendency, removes the extracted first deterioration tendency from the created two or more system data pieces, determines which one of the two or more system data pieces from which the first deterioration tendency has been removed has a strongest correlation between the abscissa of the created system data piece and the corresponding status amounts as an extracted second deterioration tendency, calculates a second estimation value of the remaining lifetime of the switching device based on the extracted second deterioration tendency, and determines the remaining lifetime of the switching device based on at least the first estimation value and the second estimation value of the remaining lifetime.

10. The switching-device remaining lifetime diagnosis apparatus according to claim 9, wherein calculating an estimation value of the remaining lifetime is repeated until there exists no deterioration tendency of the switching device in the system data having the strongest correlation, and the number of remaining-lifetime estimation values is the same as the number of the created system data pieces.

11. The switching-device remaining lifetime diagnosis apparatus according to claim 9, calculating an estimation value of the remaining lifetime is implemented by use of a correlation function based on the created system data.

12. The switching-device remaining lifetime diagnosis apparatus according to claim 9, wherein calculating an estimation value of the remaining lifetime is implemented by use of the difference between the created system data and a regression line or a regression curve based on the created system data.

13. The switching-device remaining lifetime diagnosis apparatus according to claim 9, wherein a plurality of the switching devices are provided in a single and the same plant; and the remaining lifetime estimation unit creates the two or more system data pieces for the switching device, among the plurality of the switching devices, that have been most frequently operated, and estimates the remaining lifetimes of the other switching devices, based on the created system data pieces.

14. A switching-device remaining lifetime diagnosis apparatus for diagnosing the remaining lifetime of a switching device that drives a movable contact by a driving mechanism in such a way that the movable contact makes contact with or is separated from a fixed contact, in order to open or close an electric circuit, the switching-device remaining lifetime diagnosis apparatus comprising:

a measurement unit that measures performance characteristics of the switching device;

a status amount estimation unit that estimates a status amount related to a deterioration status of the switching device, based on measurement data obtained by the measurement unit;

a recording unit that records as status amount history data the status amount estimated by the status amount estimation unit; and a remaining lifetime estimation unit that estimates the remaining lifetime of the switching device, based on the status amount history data recorded in the recording unit, wherein the remaining lifetime estimation unit transforms the status amounts in the accumulated status amount history data by use of a predetermined transformation function into predetermined status amounts, and then creates two or more system data pieces each of the two or more system data pieces including one of a first system data piece in which the predetermined status amounts are arranged with the abscissa of at least part of an elapsed time during an operation period of the switching device, a second system data piece in which the predetermined status amounts are arranged with the abscissa of the number of operations of the switching device during the at least part of an elapsed time, a third system data piece in which the predetermined status amounts are arranged with the abscissa of an inoperative time of the switching device during the at least part of an elapsed time, and a fourth system data piece in which the predetermined status amounts are arranged with the abscissa of an accumulated operation time of the switching device during the at least part of an elapsed time;

the remaining lifetime estimation unit also determines which one of the created two or more system data pieces has a strongest correlation between the abscissa of the created system data piece and the corresponding predetermined status amounts as an extracted first deterioration tendency of the switching device, calculates a first estimation value of the remaining lifetime of the switching device based on the extracted first deterioration tendency, removes the extracted first deterioration tendency from the created two or more system data pieces, determines which one of the two or more system data pieces from which the first deterioration tendency has been removed has a strongest correlation between the abscissa of the system data piece and the corresponding predetermined status amounts as an extracted second deterioration tendency, calculates a second estimation value of the remaining lifetime of the switching device based on the extracted second deterioration tendency, and determines the remaining lifetime of the switching device based on at least the first estimation value and the second estimation value of the remaining lifetime.

15. The switching-device remaining lifetime diagnosis apparatus according to claim 14, wherein the predetermined transformation function differs depending on each of the system data pieces.

16. A switching-device remaining lifetime diagnosis apparatus for diagnosing the remaining lifetime of a switching device that drives a movable contact by a driving mechanism in such a way that the movable contact makes contact with or is separated from a fixed contact, in order to open or close an electric circuit, the switching-device remaining lifetime diagnosis apparatus comprising:

a measurement unit that measures performance characteristics of the switching device;

a status amount estimation unit that estimates a status amount related to a deterioration status of the switching device, based on measurement data obtained by the measurement unit;

a recording unit that records as status amount history data the status amount estimated by the status amount estimation unit; and a remaining lifetime estimation unit that estimates the remaining lifetime of the switching device, based on the status amount history data recorded in the recording unit, wherein based on the accumulated status amount history data, the remaining lifetime estimation unit creates two or more total-elapsed-time system data pieces, each of the two or more total-elapsed-time system data pieces including one of a first total-elapsed-time system data piece in which the status amount history data are arranged with the abscissa of a total elapsed time during an operation period of the switching device, a second total-elapsed-time system data piece in which the status amount history data are arranged with the abscissa of the number of operations of the switching device during the total elapsed time, a third total-elapsed-time system data piece in which the status amount history data are arranged with the abscissa of an inoperative time of the switching device during the total elapsed time, and a fourth total-elapsed-time system data piece in which the status amount history data are arranged with the abscissa of an accumulated operation time of the switching device during the total elapsed time, and, at the same time, creates two or more post-predetermined-period system data pieces, each of the two or more post-predetermined-period system data piece including one of a first post-predetermined-period system data piece in which the status amount history data are arranged with the abscissa of an elapsed time during a period after the time point when a predetermined period has elapsed from a time point when the switching device had initially started to operate, a second post-predetermined-period system data piece in which the status amount history data are arranged with the abscissa of the number of operations of the switching device in an elapsed time during a period after the time point when the predetermined period has elapsed, a third post-predetermined-period system data piece in which the status amount history data are arranged with the abscissa of an inoperative time of the switching device in an elapsed time during a period after the time point when the predetermined period has elapsed, and a fourth post-predetermined-period system data piece in which the status amount history data are arranged with the abscissa of an accumulated operation time of the switching device in an elapsed time during a period after the time point when the predetermined period has elapsed;

the remaining lifetime estimation unit also determines which one of the created two or more total-elapsed-time system data pieces or the created two or more post-predetermined-period system data pieces has a strongest correlation between the abscissa of the created system data piece and the corresponding status amounts as an extracted first deterioration tendency of the switching device, calculates a first estimation value of the remaining lifetime of the switching device based on the extracted first deterioration tendency, removes the extracted first deterioration tendency from the created two or more system data pieces, determines which one of the two or more system data pieces from which the first deterioration tendency has been removed has a strongest correlation between the abscissa of the created system data and the corresponding status amounts as an extracted a second deterioration tendency, calculates a second estimation value of the remaining lifetime of the switching device based on the extracted second deterioration tendency, and determines the remaining lifetime of the switching device based on at least the first estimation value and the second estimation value.

17. The switching-device remaining lifetime diagnosis apparatus according to any one of claims 15 through 12, wherein the estimation of the remaining lifetime is implemented by use of the difference between a predetermined value and a regression line or a regression curve based on the created system data.

18. The switching-device remaining lifetime diagnosis apparatus according to any one of claims 15 through 13, wherein the remaining lifetime estimation unit creates a plurality of the system data pieces and estimates a factor of deterioration in the switching device, based on the system data, among the plurality of the created system data pieces, that indicates most conspicuously a deterioration tendency of the switching device.

19. The switching-device remaining lifetime diagnosis apparatus according to any one of claims 15 through 13, wherein the remaining lifetime estimation unit creates a plurality of the system data pieces, calculates an estimation value of the remaining lifetime of the switching device for each of the plurality of the created system data pieces, then, estimates, as the remaining lifetime of the switching device, the estimation value, among the calculated estimation values, that is the smallest.

20. The switching-device remaining lifetime diagnosis apparatus according to any one of claims 15 through 13, wherein a plurality of the switching devices is provided in a single and the same plant; and wherein the remaining lifetime estimation unit creates at least one of the system data pieces for the switching device, among the plurality of the switching devices, that has been most frequently operated, and estimates the remaining lifetimes of the other switching devices, based on the created system data pieces.

* * * * *